US011600630B2

(12) United States Patent
Greenlee et al.

(10) Patent No.: US 11,600,630 B2
(45) Date of Patent: Mar. 7, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Jordan D. Greenlee, Boise, ID (US); Nancy M. Lomeli, Boise, ID (US); John D. Hopkins, Meridian, ID (US); Jiewei Chen, Boise, ID (US); Indra V. Chary, Boise, ID (US); Jun Fang, Boise, ID (US); Vladimir Samara, Boise, ID (US); Kaiming Luo, Singapore (SG); Rita J. Klein, Boise, ID (US); Xiao Li, Boise, ID (US); Vinayak Shamanna, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 16/988,156

(22) Filed: Aug. 7, 2020

(65) Prior Publication Data

US 2022/0045075 A1   Feb. 10, 2022

(51) Int. Cl.
*H01L 27/11568*   (2017.01)
*H01L 27/11556*   (2017.01)
(Continued)

(52) U.S. Cl.
CPC ........ *H01L 27/11556* (2013.01); *G11C 5/025* (2013.01); *G11C 5/06* (2013.01);
(Continued)

(58) Field of Classification Search
None
See application file for complete search history.

(56) References Cited

U.S. PATENT DOCUMENTS

| 2013/0127011 A1* | 5/2013 | Higashitani | H01L 28/87 257/532 |
| 2015/0162342 A1* | 6/2015 | Lee | H01L 29/66833 438/269 |

(Continued)

OTHER PUBLICATIONS

WO PCT/US2021/043446 Search Rept., dated Nov. 16, 2021, Micron Technology, Inc.

(Continued)

*Primary Examiner* — Sarah K Salerno
(74) *Attorney, Agent, or Firm* — Wells St. John P.S.

(57) ABSTRACT

Some embodiments include an integrated assembly having a source structure, and having a stack of alternating conductive levels and insulative levels over the source structure. Cell-material-pillars pass through the stack. The cell-material-pillars are arranged within a configuration which includes a first memory-block-region and a second memory-block-region. The cell-material-pillars include channel material which is electrically coupled with the source structure. Memory cells are along the conductive levels and include regions of the cell-material-pillars. A panel is between the first and second memory-block-regions. The panel has a first material configured as a container shape. The container shape defines opposing sides and a bottom of a cavity. The panel has a second material within the cavity. The second material is compositionally different from the first material. Some embodiments include methods of forming integrated assemblies.

19 Claims, 23 Drawing Sheets

(51) Int. Cl.
  *H01L 27/11582* (2017.01)
  *G11C 5/06* (2006.01)
  *H01L 21/306* (2006.01)
  *G11C 16/04* (2006.01)
  *G11C 5/02* (2006.01)

(52) U.S. Cl.
  CPC ...... *G11C 16/0408* (2013.01); *G11C 16/0466* (2013.01); *H01L 21/30625* (2013.01); *H01L 27/11568* (2013.01); *H01L 27/11582* (2013.01)

(56) References Cited

U.S. PATENT DOCUMENTS

| | | |
|---|---|---|
| 2016/0079263 A1 | 3/2016 | Yasuda |
| 2017/0077130 A1* | 3/2017 | Hu ..................... H01L 23/5283 |
| 2017/0148807 A1* | 5/2017 | Shimura ........... H01L 27/11558 |
| 2017/0148852 A1 | 5/2017 | Boniardi et al. |
| 2019/0288000 A1 | 9/2019 | Choi |
| 2019/0333924 A1 | 10/2019 | Greenlee et al. |
| 2020/0013798 A1 | 1/2020 | Parekh |
| 2020/0328223 A1* | 10/2020 | Lai ................... H01L 21/76805 |
| 2020/0395379 A1* | 12/2020 | Lee ................... H01L 27/11556 |
| 2021/0043647 A1* | 2/2021 | Kim ...................... H01L 29/04 |
| 2021/0082933 A1* | 3/2021 | Ito .......................... G11C 5/025 |
| 2021/0265372 A1* | 8/2021 | Kanakamedala ............................ H01L 27/11556 |

OTHER PUBLICATIONS

WO PCT/US2021/043446 Writ. Opin., dated Nov. 16, 2021, Micron Technology, Inc.

\* cited by examiner

INTEGRATED ASSEMBLIES AND METHODS OF FORMING INTEGRATED ASSEMBLIES

TECHNICAL FIELD

Integrated assemblies (e.g., integrated memory, such as NAND memory). Methods of forming integrated assemblies.

BACKGROUND

Memory provides data storage for electronic systems. Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include methods of filling slits, such as, for example, slits which separate memory blocks within NAND memory assemblies. Some embodiments include integrated assembles (e.g., integrated memory) having slits between memory-block-regions. An example slit may comprise a first material configured as a container shape which defines an interior cavity, and may comprise a second material within the interior cavity. The second material may differ from the first material relative to one or both of composition and density. Example embodiments are described with reference to FIGS. 5-12.

Figure 1:
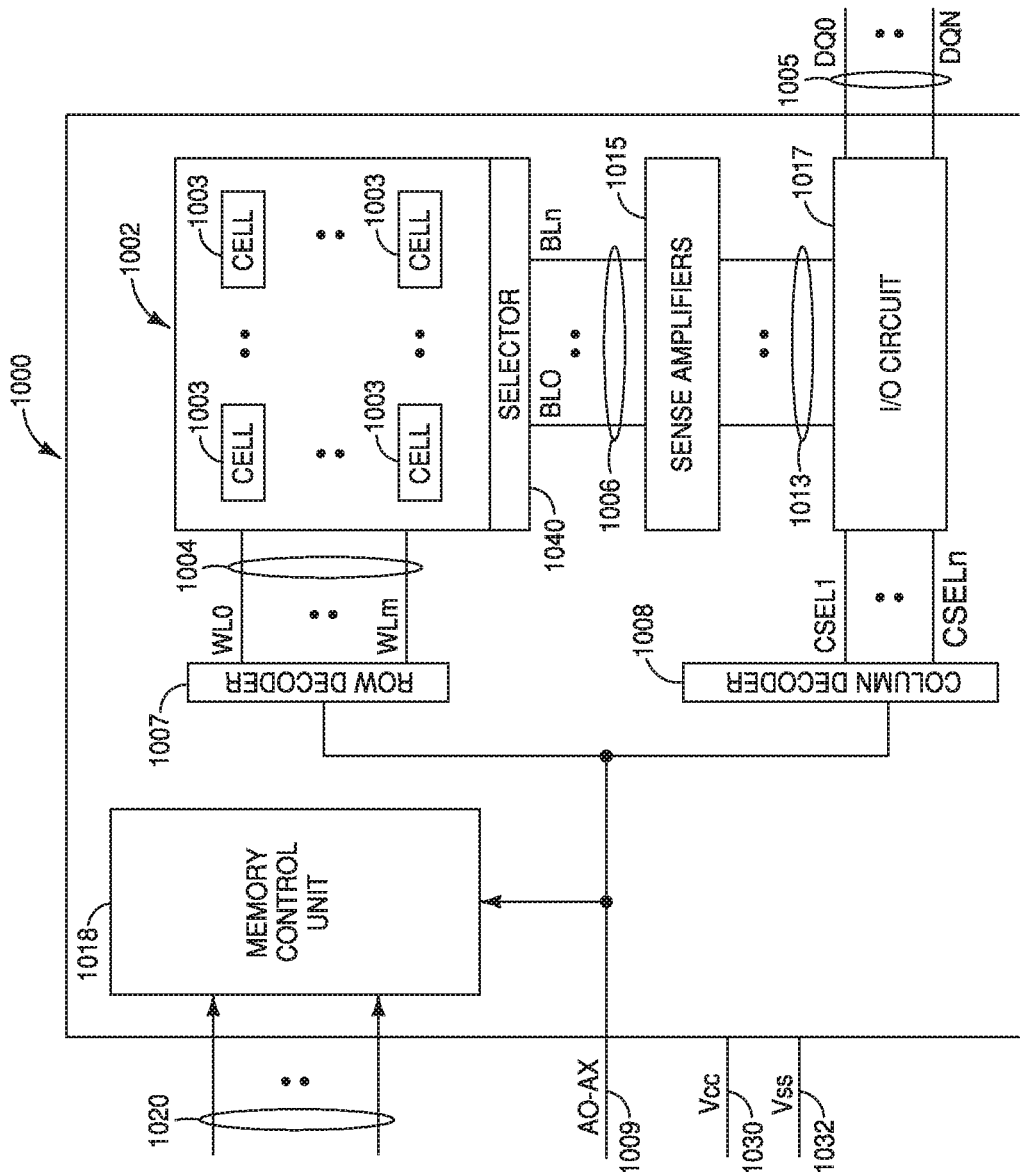
FIG. 1 shows a block diagram of a prior art memory device having a memory array with memory cells.
Figure 2:
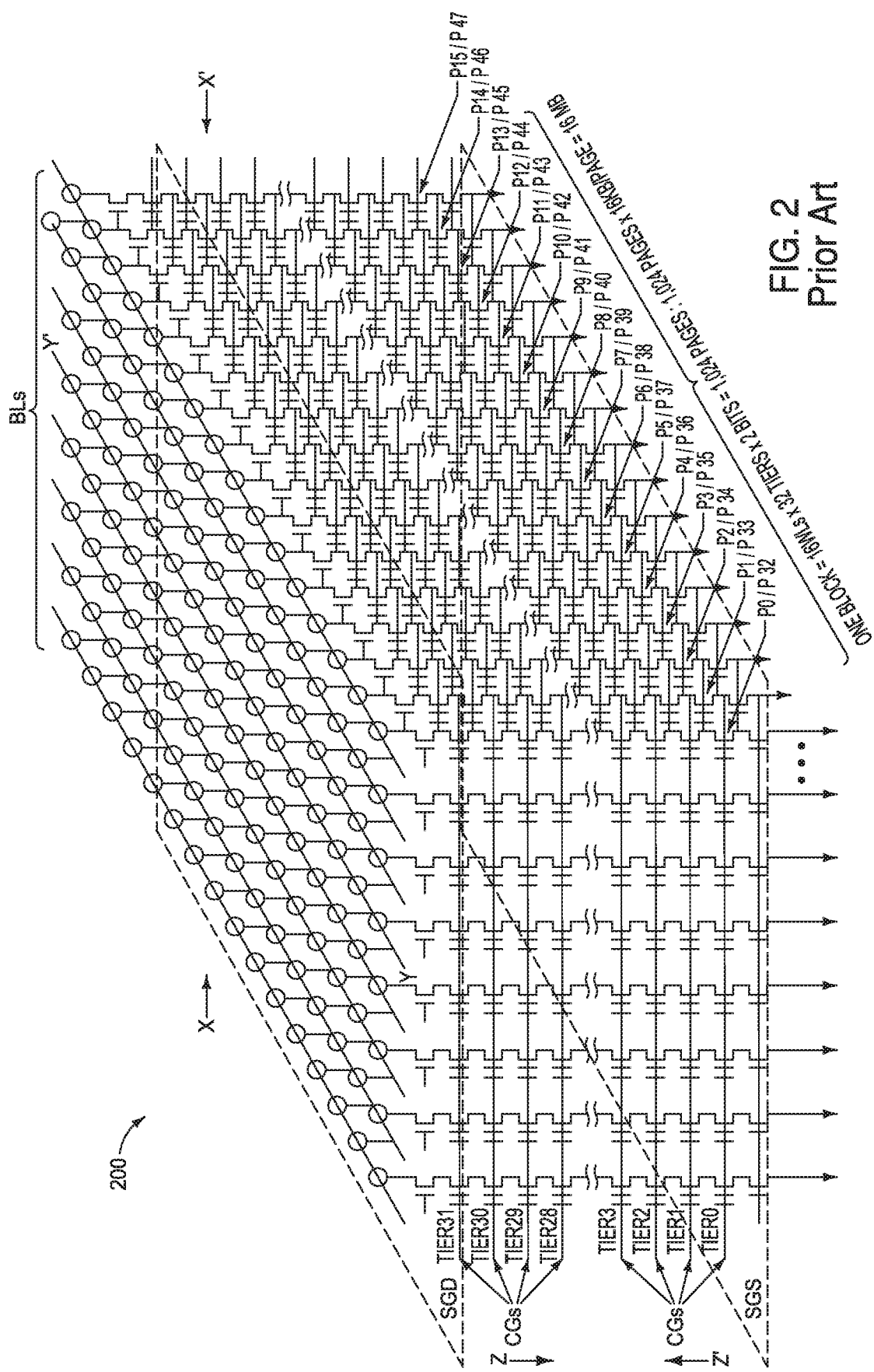
FIG. 2 shows a schematic diagram of the prior art memory array of FIG. 1 in the form of a 3D NAND memory device.
Figure 3:
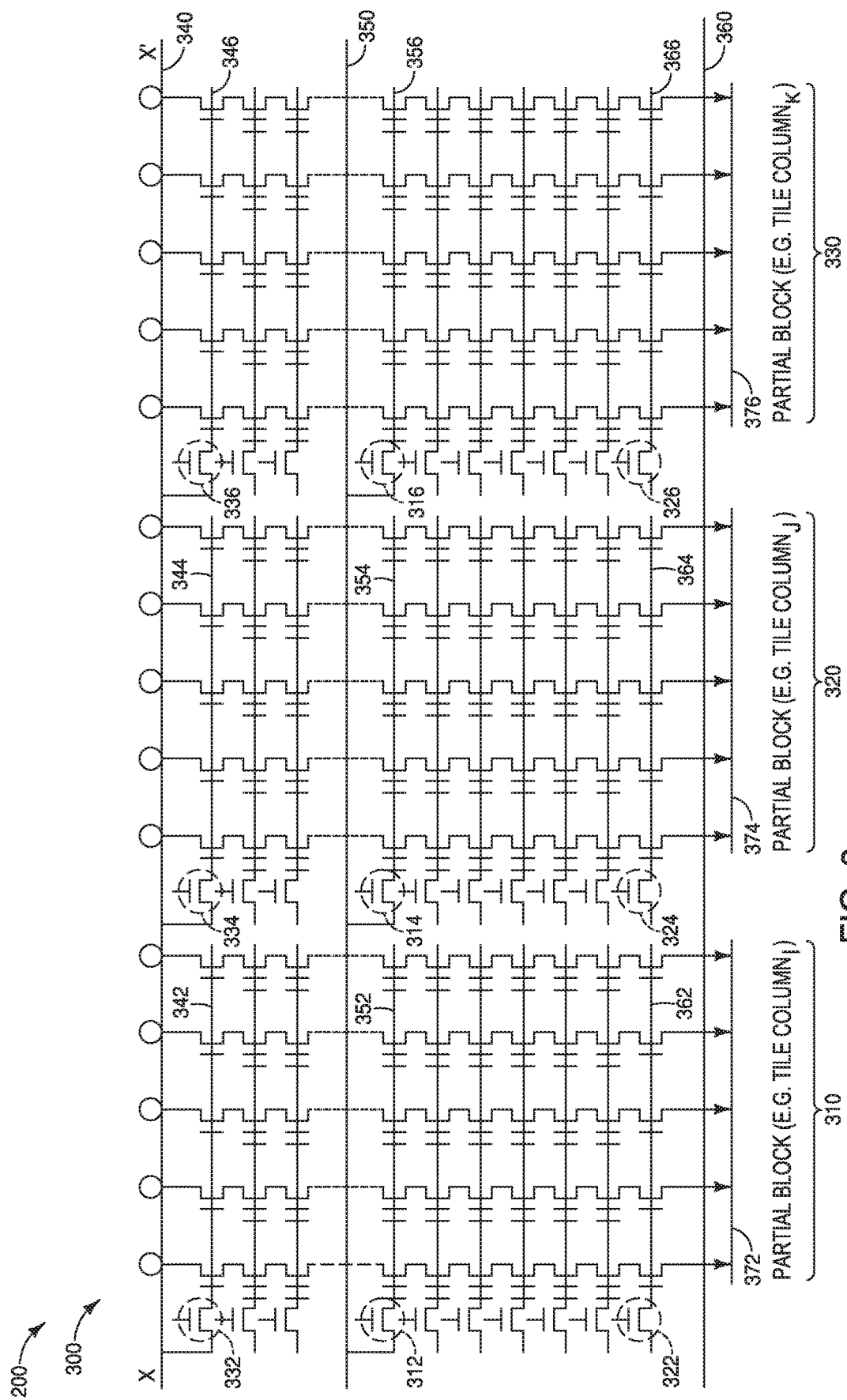
FIG. 3 shows a cross-sectional view of the prior art 3D NAND memory device of FIG. 2 in an X-X' direction.
Figure 4:
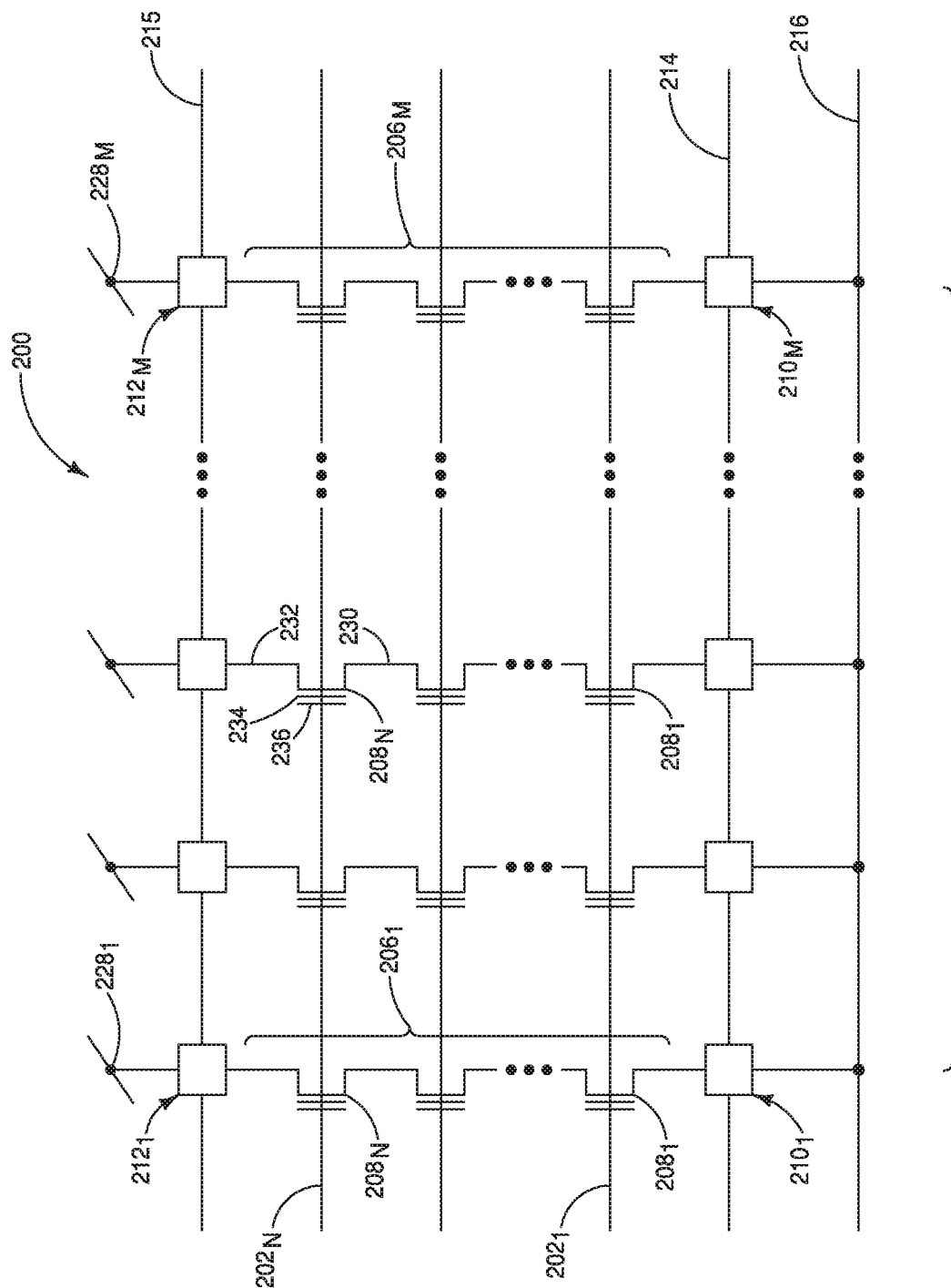
FIG. 4 is a schematic diagram of a prior art NAND memory array.
Figure 5:
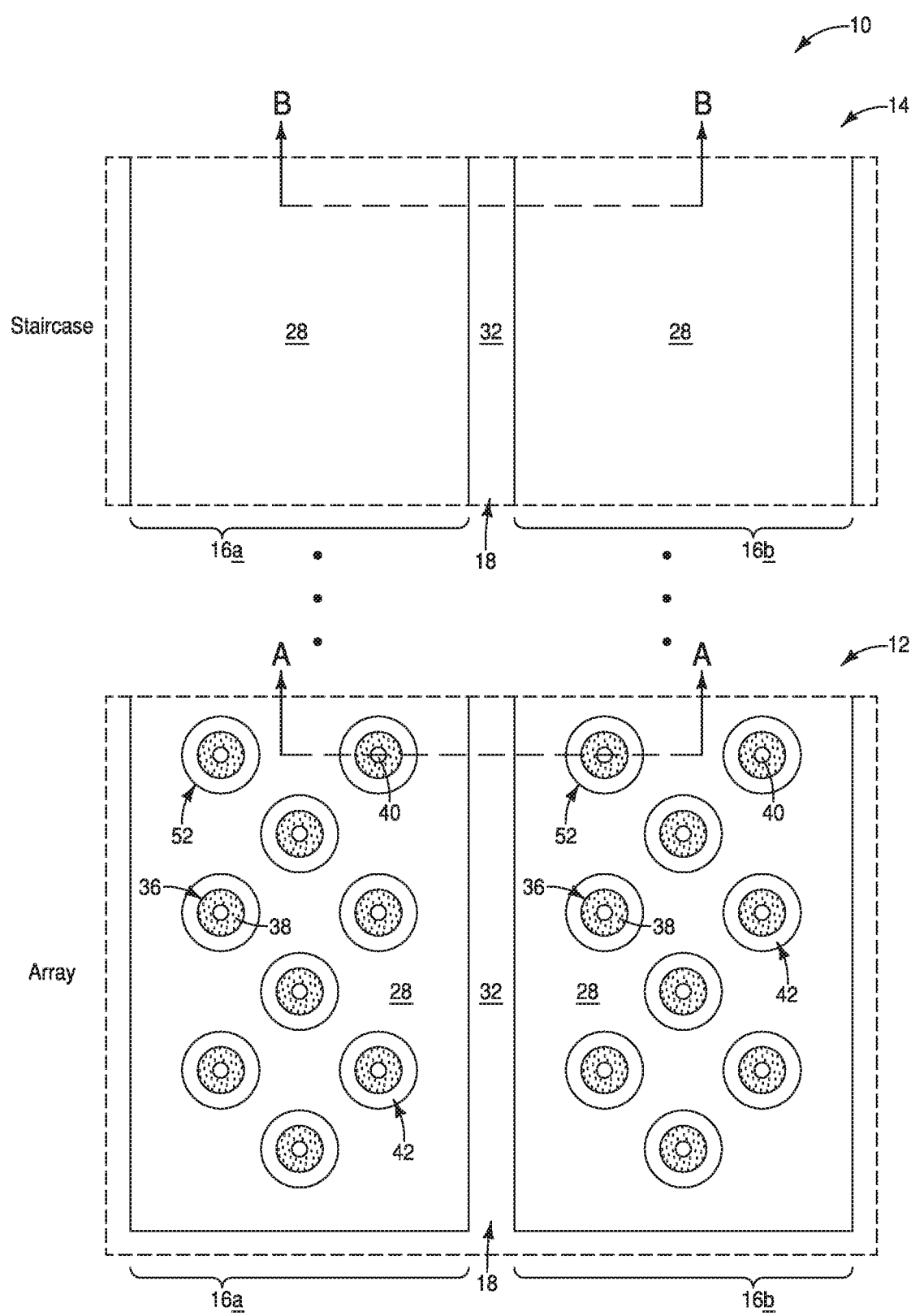
FIGS. 5-5B are a top view (FIG. 5) and cross-sectional side views (FIGS. 5A and 5B) of a region of an example integrated assembly. The views of FIGS. 5A and 5B are along the lines A-A and B-B, respectively of FIG. 5.
Figure 5A:
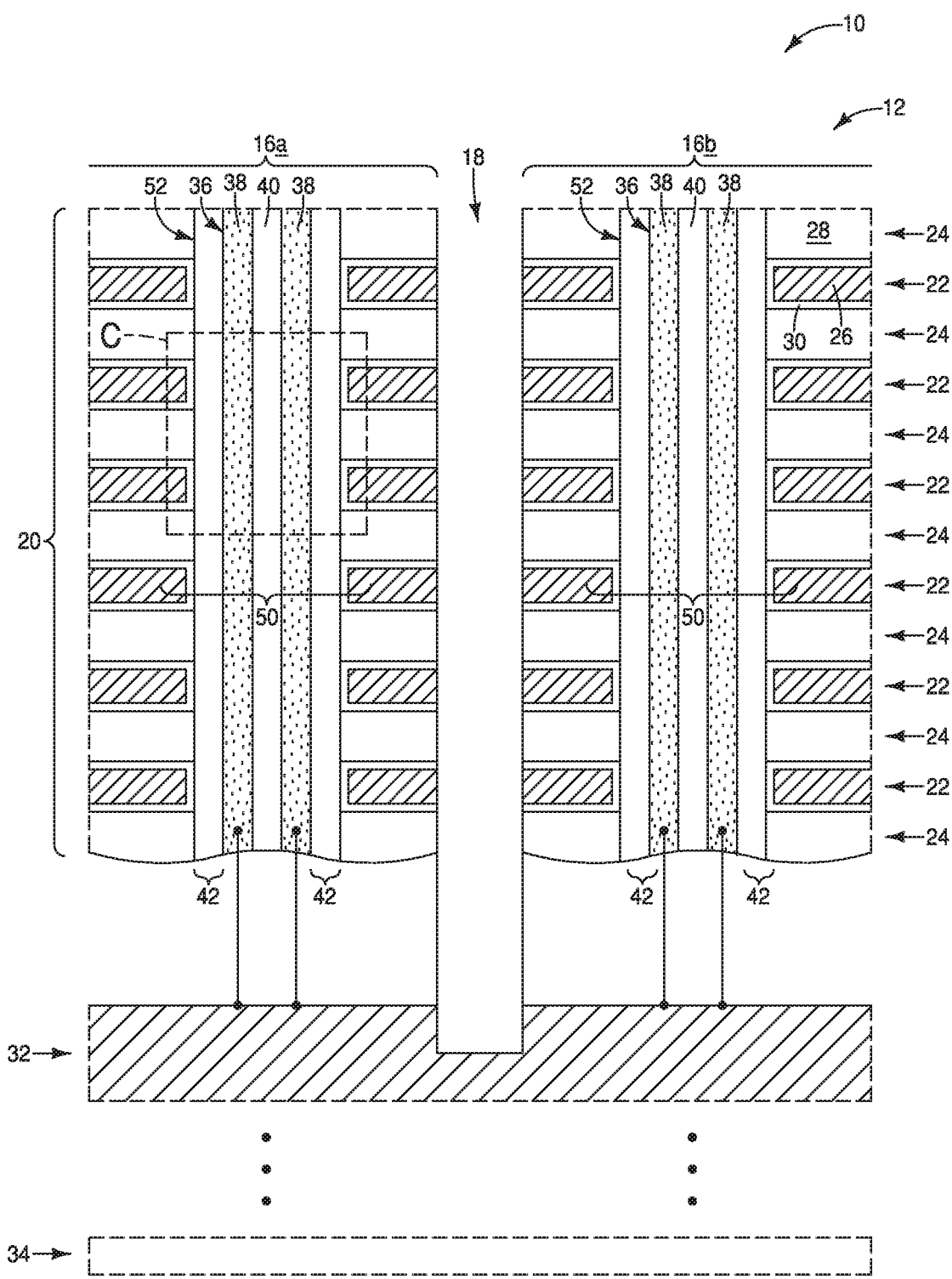
FIG. 5C is an enlarged view of a region "C" of FIG. 5A.
Figure 5B:
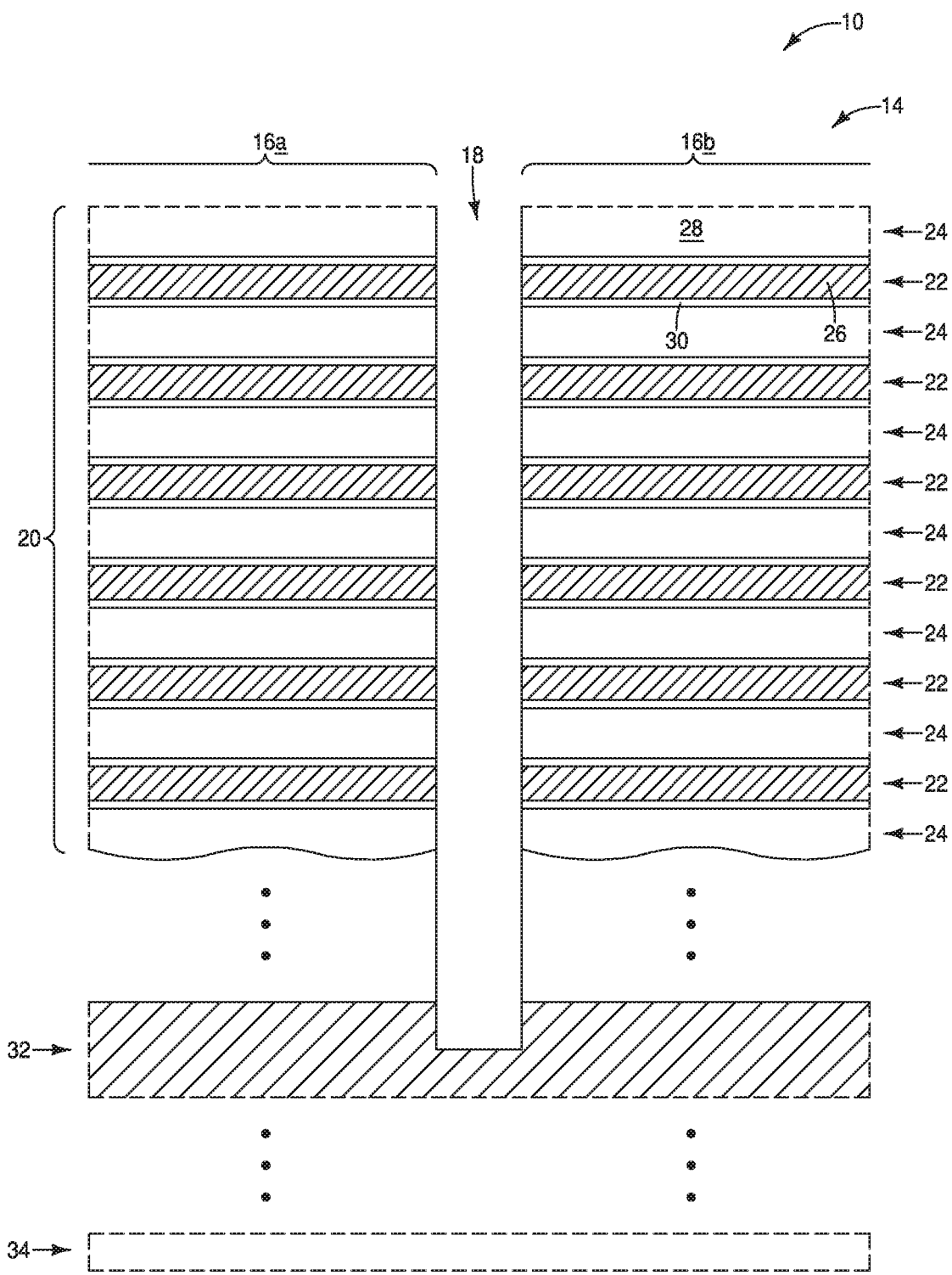

Referring to FIGS. 5-5B, regions of an example integrated assembly (memory device) 10 are illustrated. The assembly 10 includes a memory-array-region (array region) 12, and a staircase region 14 proximate the array region. The regions 12 and 14 are labeled "Array" and "Staircase", respectively, in FIG. 5.

A pair of memory-block-regions 16a and 16b extend across the regions 12 and 14. The regions 16a and 16b may be referred to as a first memory-block-region and a second memory-block-region, respectively. The first and second memory-block-regions 16a and 16b are separated from one another by an intervening slit 18.

The cross-sectional view of FIG. 5A shows that the assembly 10 includes a stack 20 of alternating conductive levels 22 and insulative levels 24. The levels 22 comprise conductive material 26, and the levels 24 comprise insulative material 28.

The conductive material 26 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 26 may include metal (e.g., tungsten) and metal nitride (e.g., tantalum nitride, titanium nitride, etc.).

In the illustrated embodiment, a dielectric barrier material 30 is along an outer periphery of the conductive material 26. The dielectric barrier material may comprise any suitable composition(s); and in some embodiments may comprise one or more of aluminum oxide, hafnium oxide, zirconium oxide, etc.

The insulative material 28 may comprise any suitable composition(s); and in some embodiments may comprise, consist essentially of, or consist of silicon dioxide.

The levels 22 and 24 may be of any suitable thicknesses; and may be the same thickness as one another or different thicknesses relative to one another. In some embodiments, the levels 22 and 24 may have vertical thicknesses within a range of from about 10 nanometers (nm) to about 400 nm.

There may be any suitable number of the conductive levels 22 within the stack 20. The conductive levels 22 may be referred to as wordline (routing, access, memory cell) levels. In some applications, the wordline levels may ultimately correspond to memory cell levels of a NAND memory configuration (NAND assembly, NAND memory device). The NAND memory configuration will include strings of memory cells (i.e., NAND strings), with the number of memory cells in the strings being determined by the number of vertically-stacked memory cell levels. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc.

The stack 20 is supported over a conductive structure 32. Such conductive structure may correspond to a source structure analogous to the structures 216 and 360 described in the Background section. The source structures of FIGS. 1-4 are referred to as "lines" in accordance with traditional nomenclature, but such lines may be comprised by conductive expanses rather than being simple wiring lines.

The conductive structure 32 may comprise any suitable composition(s), and in some embodiments may comprise a conductively-doped semiconductor-containing material (e.g., conductively-doped silicon) over a metal-containing material (e.g., a material comprising $WSi_x$, where x is greater than 0).

The slit 18 is shown to penetrate into the conductive structure 32 (e.g., to penetrate into conductively-doped silicon of the conductive structure). In other embodiments, the slit may stop at an upper surface of the conductive structure 32.

The conductive structure (source structure) 32 is supported by a semiconductor base 34. The base 34 may comprise semiconductor material; and may, for example, comprise, consist essentially of, or consist of monocrystalline silicon. The base 34 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 34 may correspond to a semiconductor substrate containing one or more materials associated with integrated circuit fabrication. Such materials may include, for example, one or more of refractory metal materials, barrier materials, diffusion materials, insulator materials, etc.

The conductive structure 32 may be electrically coupled with CMOS (complementary metal oxide semiconductor). The CMOS (not shown) may be in any suitable location relative to the conductive structure 32, and in some embodiments at least some of the CMOS may be under such conductive structure (e.g., may be associated with the base 34). The CMOS may comprise logic and/or other appropriate circuitry for driving the source structure 32 during operation of memory associated with the stack 20.

Channel-material-pillars 36 extend through the stack 20. The channel-material-pillars comprise channel material 38. The channel material 38 may comprise any suitable composition(s); and in some embodiments may comprise one or more semiconductor materials (e.g., may comprise, consist essentially of, or consist of appropriately-doped silicon).

In the illustrated embodiment, the channel-material-pillars 36 are configured as annular rings, and insulative material 40 is within such rings. The insulative material 40 may comprise any suitable composition(s); and in some embodiments may comprise, consist essentially of, or consist of silicon dioxide. The illustrated configuration of the channel material pillars may be considered to be a hollow-pillar configuration, with the insulative material 40 being formed within the "hollows" of the pillars 36. In other embodiments, the pillars 36 may be configured as solid configurations rather than the illustrated hollow configurations.

Figure 5C:
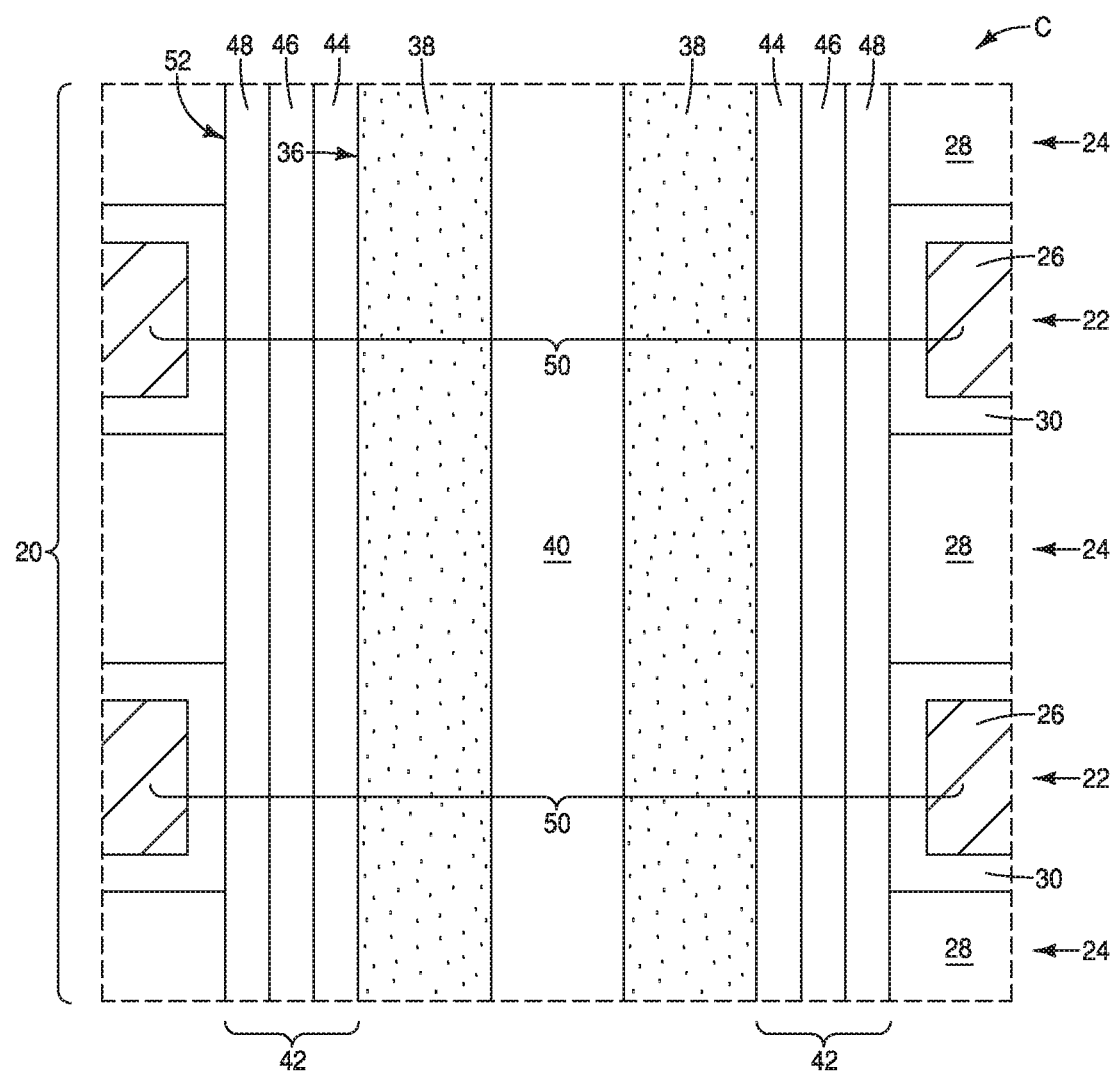

The channel material 38 is spaced from the stack 20 by intervening regions 42. FIG. 5C shows an expanded region "C" of FIG. 5A, and shows that the intervening regions 42 may comprise gate dielectric material 44, charge-trapping material 46 and charge-blocking material 48.

The gate dielectric material (tunneling material) 44 may comprise any suitable composition(s); such as, for example, one or more of silicon dioxide, silicon nitride, silicon oxynitride, etc. In some embodiments, the gate dielectric material 44 may be bandgap-engineered to achieve desired tunneling properties.

The charge-trapping material 46 may comprise any suitable composition(s); and in some embodiments may comprise, consist essentially of, or consist of silicon nitride.

The charge-blocking material 48 may comprise any suitable composition(s); and in some embodiments may comprise, consist essentially of, or consist of one or more of silicon dioxide, silicon oxynitride, etc.

The channel-material-pillars 36 may be considered to be comprised by cell-material-pillars 52, with such cell-material-pillars including the cell materials 44, 46 and 48 in addition to the channel material 38.

Vertically-stacked memory cells 50 (only some of which are labeled in FIG. 5A) are along the conductive wordline levels 22. Such memory cells may be arranged in vertical NAND strings of the types described in FIGS. 1-4. The memory cells 50 comprise regions of the cell-material-pillars 52.

The channel material 38 of the channel-material-pillars 36 is electrically coupled with the source structure 32. Source-select-devices (e.g., source-side select gates, SGSs) may be provided between the stack 20 and the source structure 32. Such source-select-devices are not shown in FIG. 5A.

The cell-material-pillars 52 may be arranged in any suitable configuration; and in some embodiments may be in a tightly-packed arrangement, such as, for example, a hexagonally-packed arrangement.

FIG. 5B shows that the staircase region 14 comprises a region of the stack 20. The wordline levels 22 may be coupled with interconnects (not shown) in the staircase region, with such interconnects extending to row decoder circuitry of the type described in the Background section.

Figure 6:
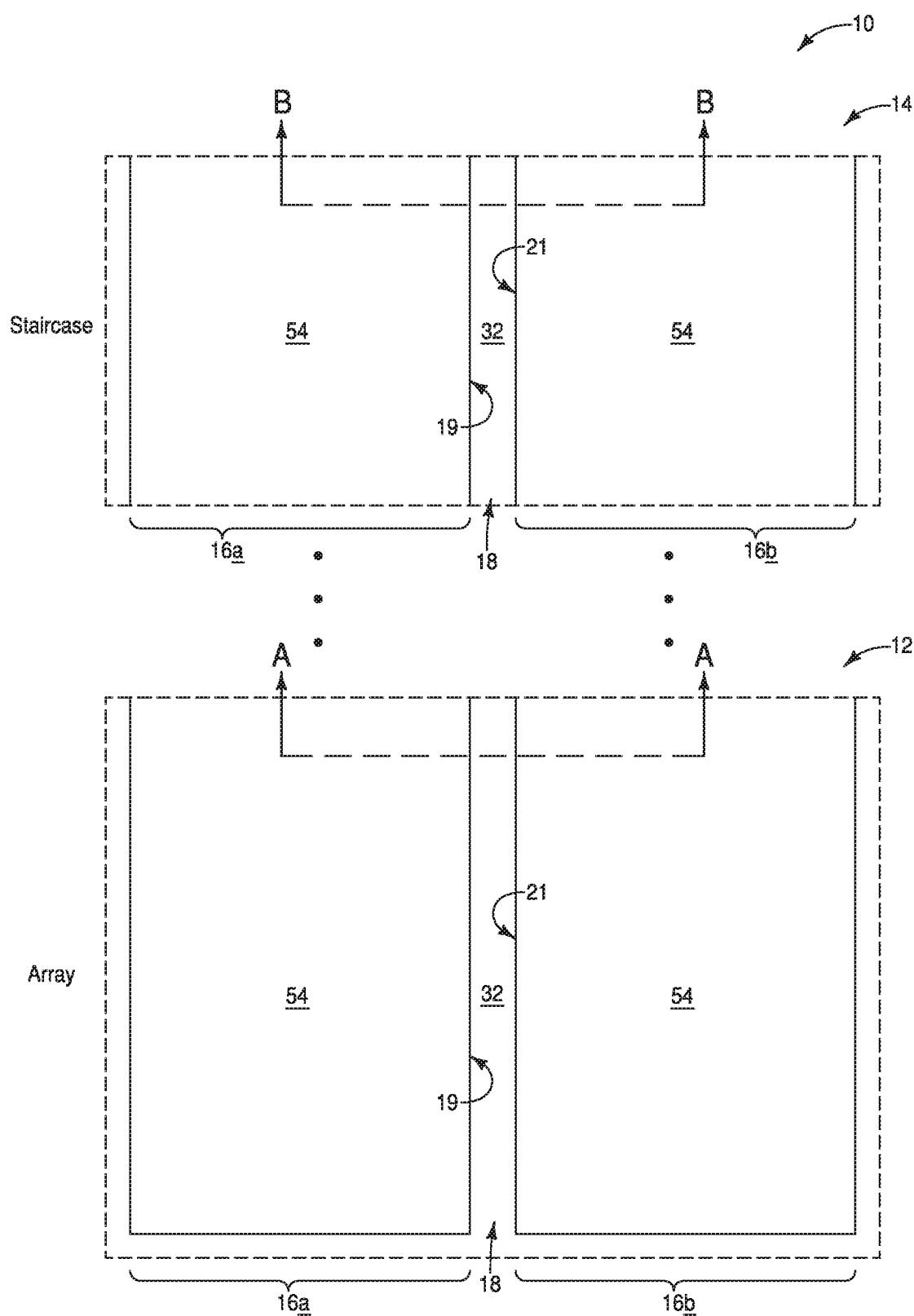
FIGS. 6-6B are a top view (FIG. 6) and cross-sectional side views (FIGS. 6A and 6B) of a region of an example integrated assembly at an example process stage of an example method. The views of FIGS. 6A and 6B are along the lines A-A and B-B, respectively of FIG. 6.
Figure 6A:
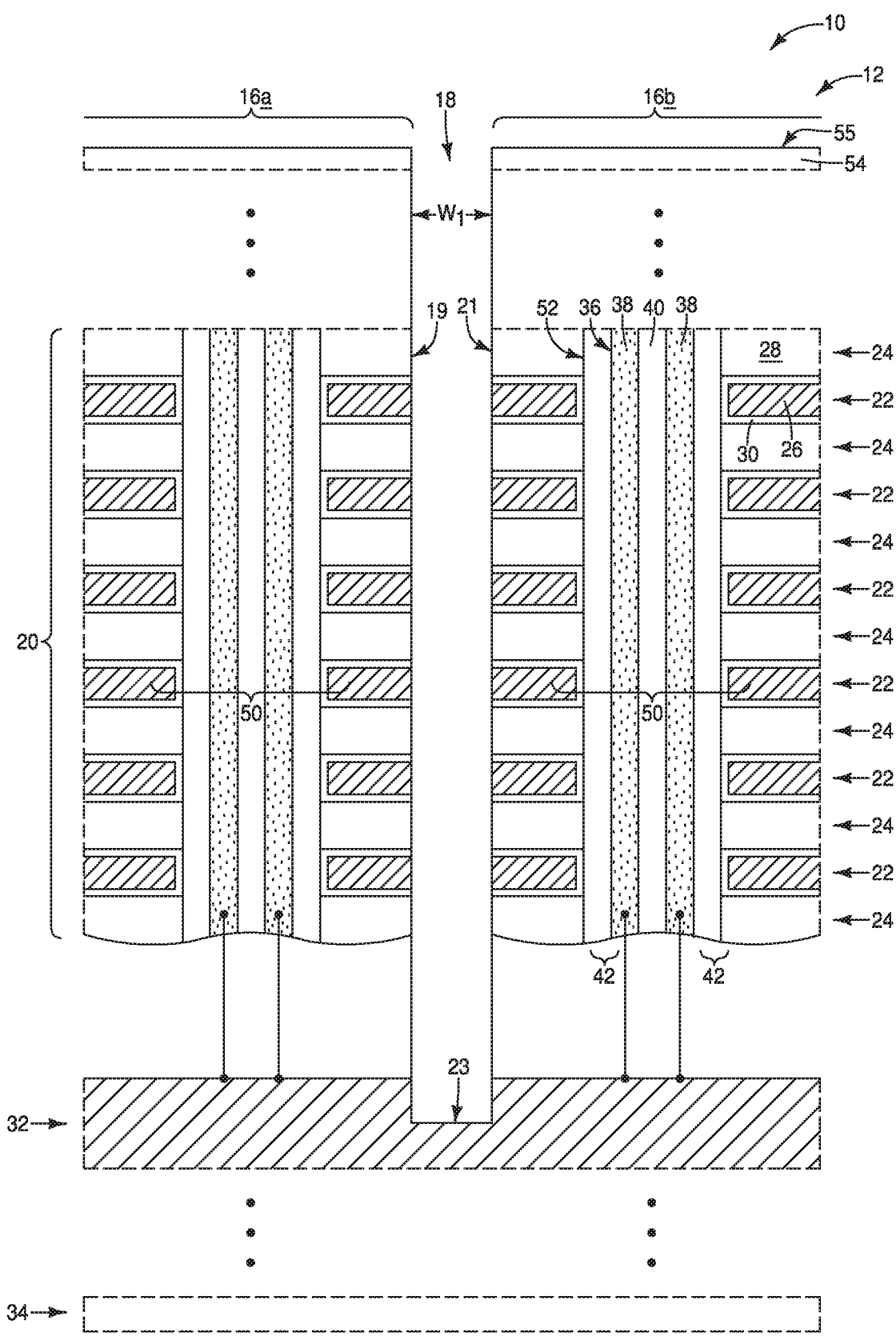
Figure 6B:
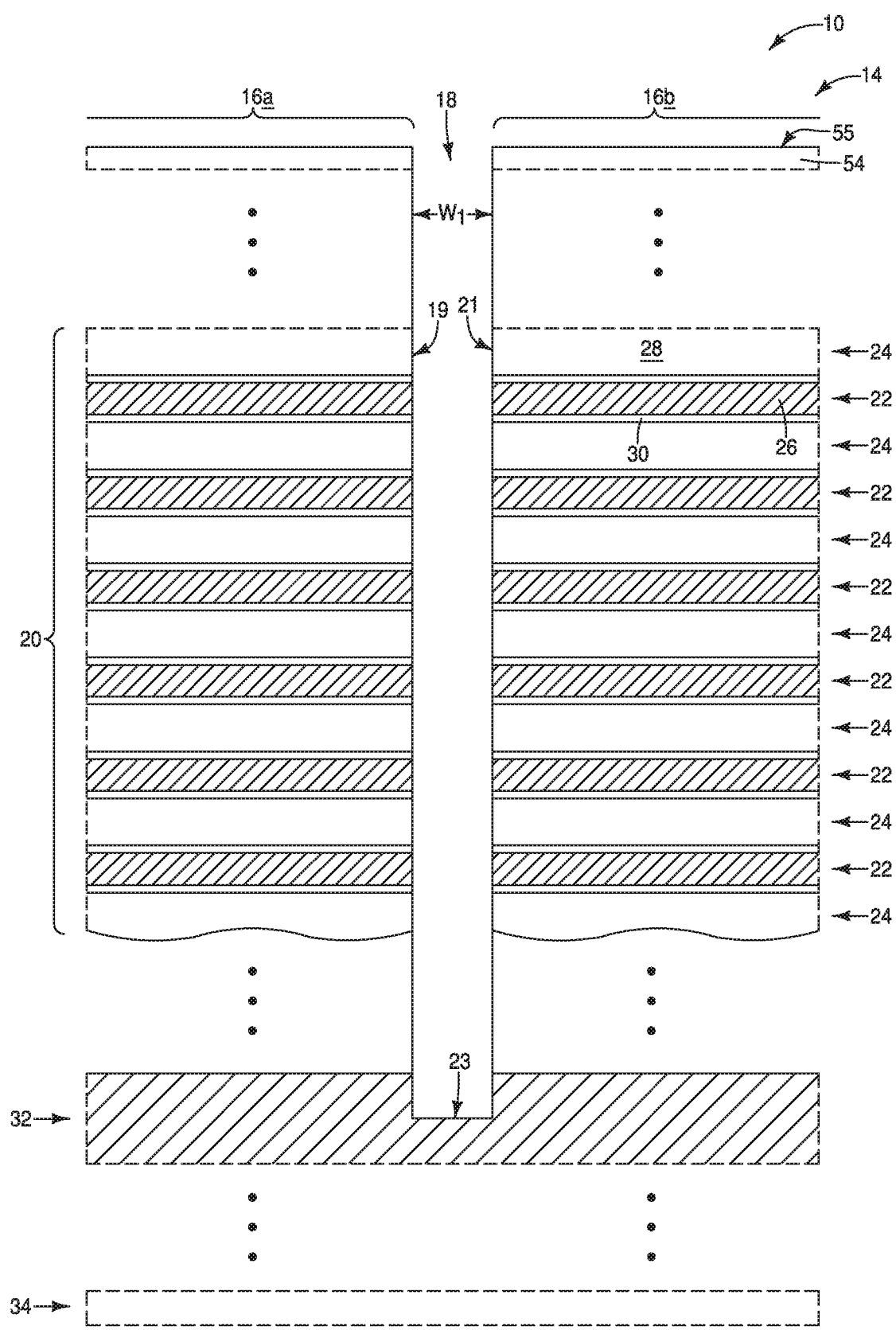

FIGS. 6-6B show a different view of the assembly 10 of FIGS. 5-5B, and specifically show a top material 54 over the assembly. The top material 54 may be an insulative material (e.g., silicon dioxide). In some embodiments, a top of the assembly may not be a single material, but may comprise multiple materials. If the top comprises multiple materials, some of the materials may be conductive and/or semiconductive. Regardless of whether the top of the assembly comprises the single shown material 54 or multiple materials, the slit 18 extends through the top material(s) and through the stack 20, and in the shown embodiment extends down to at least an upper surface of the source structure 32.

A planarized surface 55 is shown to be formed across the upper material 54. The planarized surface 55 may be formed with any suitable processing, including, for example, chemical-mechanical polishing (CMP). The slit 18 may be formed after forming the planarized surface 55 in some embodiments.

The slit 18 has first and second opposing sidewalls 19 and 21, with such sidewalls extending to a bottom 23 of the slit. The bottom 23 is along the conductive source structure 32.

The slit 18 may have any suitable width $W_1$. In some embodiments, the width $W_1$ may be within a range of from about 100 nm to about 300 nm.

Figure 7A:
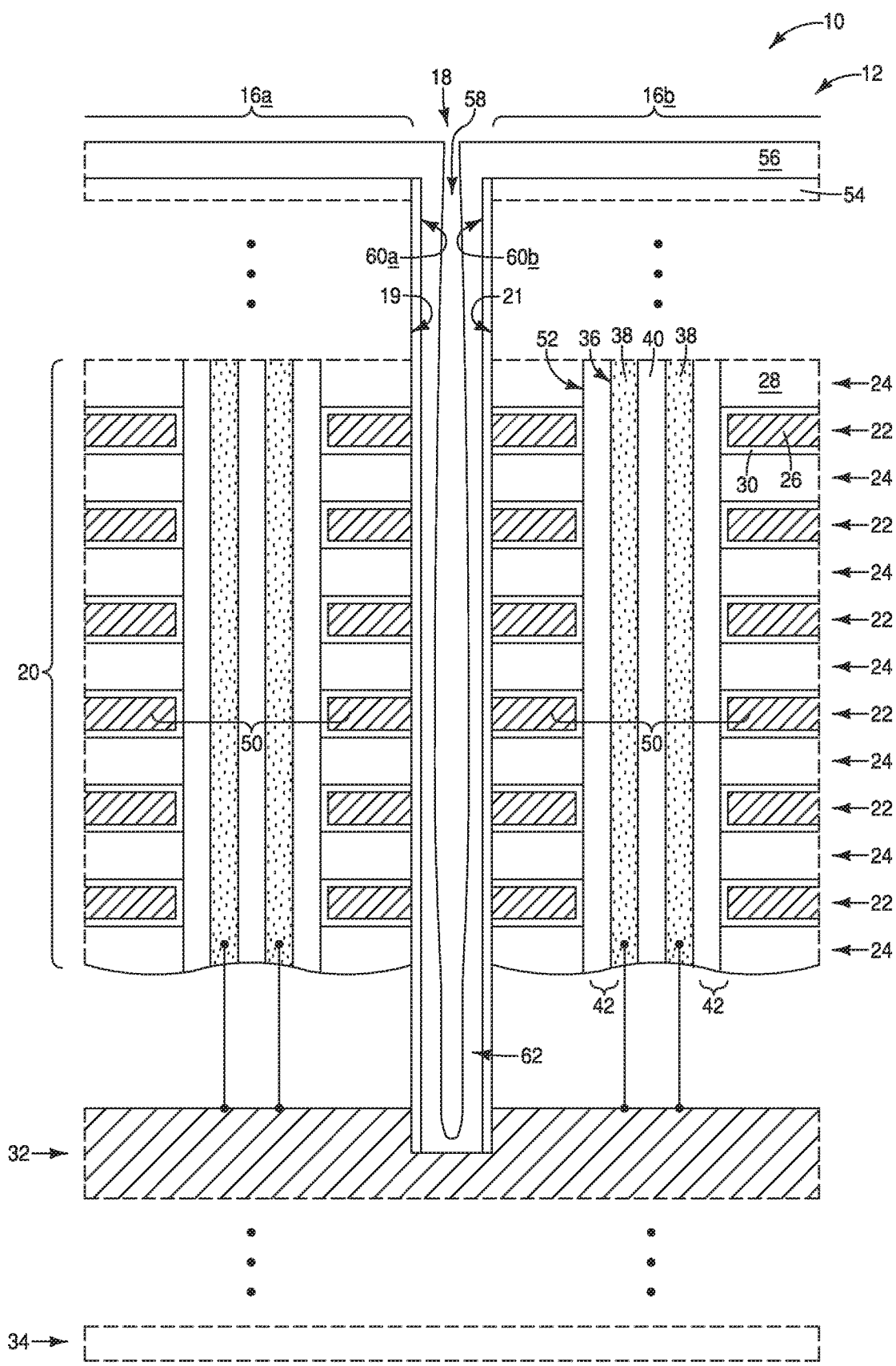
FIGS. 7A and 7B are cross-sectional side views along the same cross-sections as FIGS. 6A and 6B, respectively, at an example process stage subsequent to that of FIGS. 6A and 6B.
Figure 7B:
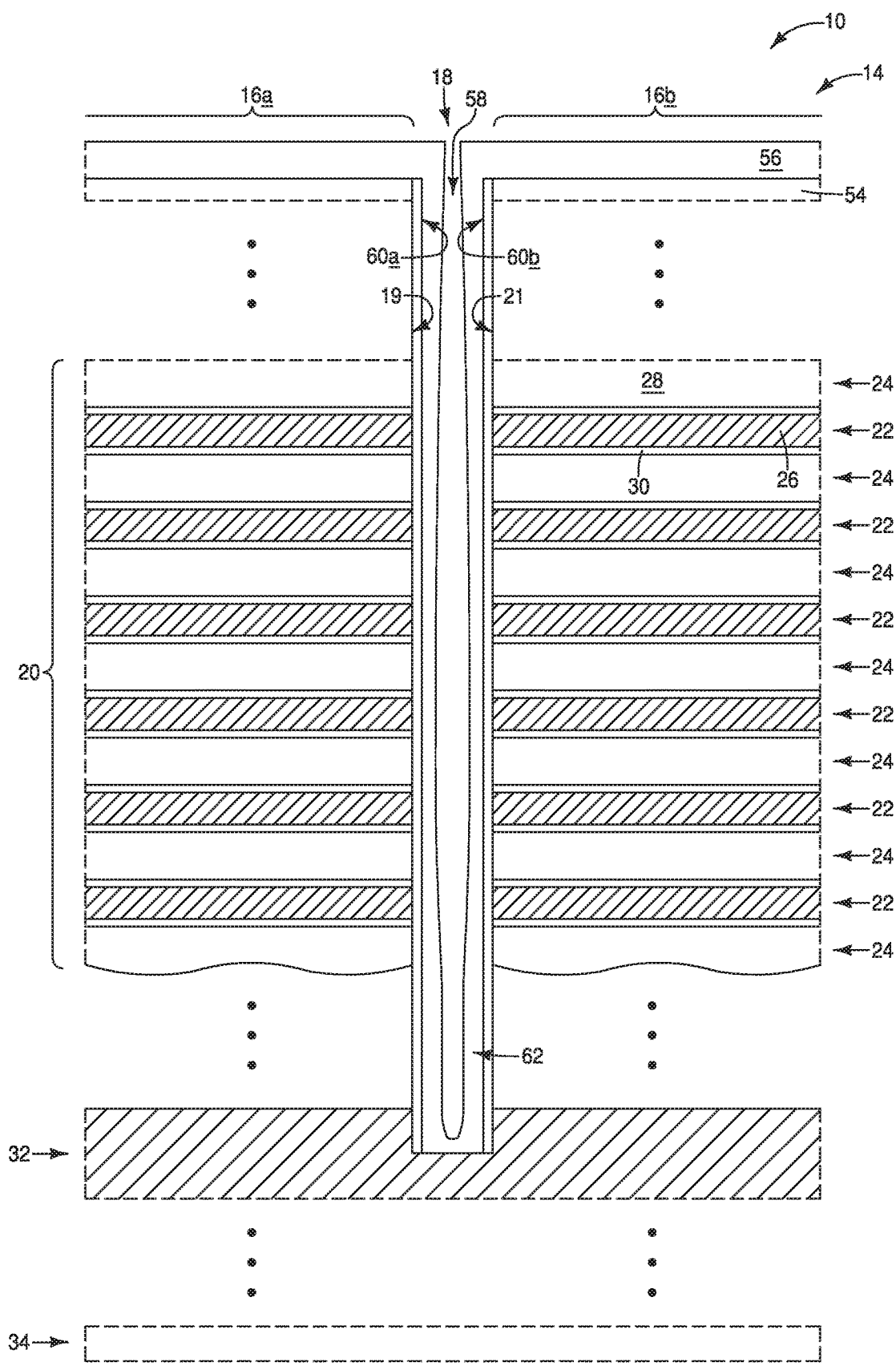

Referring to FIGS. 7A and 7B, the array region 12 (FIG. 7A) and staircase region 14 (FIG. 7B) are shown at a process stage subsequent to that of FIGS. 6A and 6B. Specifically, a first material 56 is formed within the slit 18 to partially fill the slit. A cavity 58 remains within the partially-filled slit. The first material 56 may be formed with any suitable processing, including, for example, chemical vapor deposition (CVD). As the first material is formed within the slit 18, an upper region of the first material may pinch before the slit is completely filled which may trap a void within the slit. Any voids remaining within the slits 18 of a finished construction may be detrimental to the overall strength of a completed die, which may adversely impact die integrity, and which may even lead to device failure. Embodiments described herein may avoid the problematic trapping of voids within the slits.

The first material 56 may comprise any suitable composition(s).

In some embodiments, the first material 56 may comprise one or more conductive compositions. For instance, the first material 56 may comprise one or more metals or metal-containing compositions (e.g., the first material 56 may comprise, consist essentially of, or consist of tungsten (W)).

In some embodiments, the first material 56 may comprise semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the first material 56 may comprise, consist essentially of, or consist of one or both of silicon (Si) and germanium (Ge).

In some embodiments, the first material 56 may comprise one or more insulative compositions. For instance, the first material 56 may comprise, consist essentially of, or consist of one or both of silicon dioxide and silicon nitride.

In the illustrated embodiment, optional sidewall spacers 60a and 60b are formed along the first and second sidewalls 19 and 21 of the slit 18 prior to the formation of the first material 56. The sidewall spacers may comprise insulative material, and in some embodiments may comprise, consist essentially of, or consist of one or both of silicon nitride and silicon dioxide. The optional sidewall spacers 60a and 60b may be considered to narrow the slit 18. In some embodiments, the spacers 60a and 60b may be part of a liner that extends along the bottom of the slit 18 as well as along the sidewalls 19 and 21.

In some embodiments, the first material 56 within the slit 18 may be considered to be configured as a container shape 62. A bottom of the container shape 62 is directly against the conductive source structure 32 in the illustrated embodiment. If the spacer material (e.g., the material of spacers 60a and 60b) extends along the bottom of the slit 18, then the bottom of the container shape 62 may be offset from the conductive structure 32 by the spacer material.

The cavity 58 may be considered to correspond to an interior region of the container shape 62.

Figure 8A:
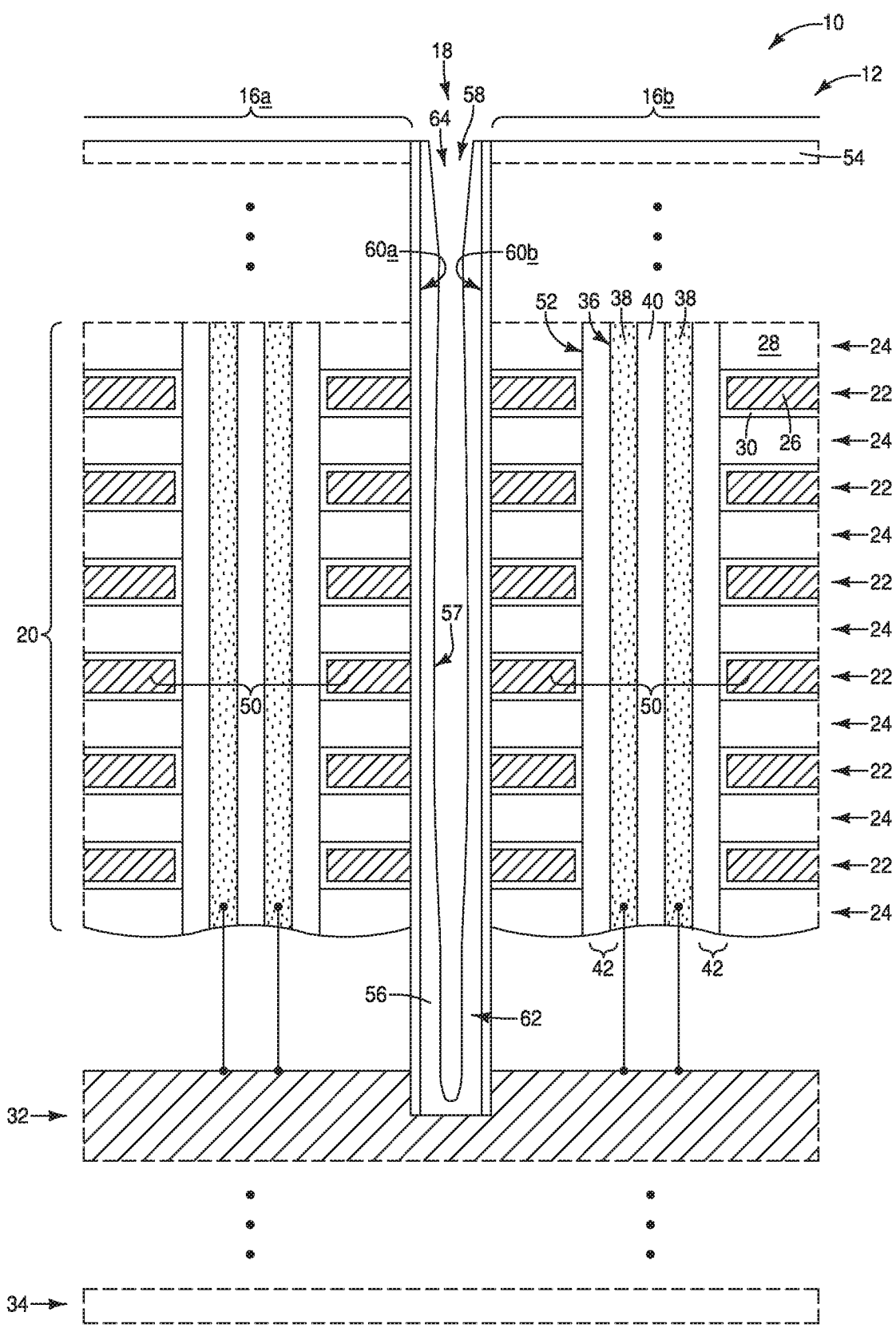
FIGS. 8A and 8B are cross-sectional side views along the same cross-sections as FIGS. 6A and 6B, respectively, at an example process stage subsequent to that of FIGS. 7A and 7B.
Figure 8B:
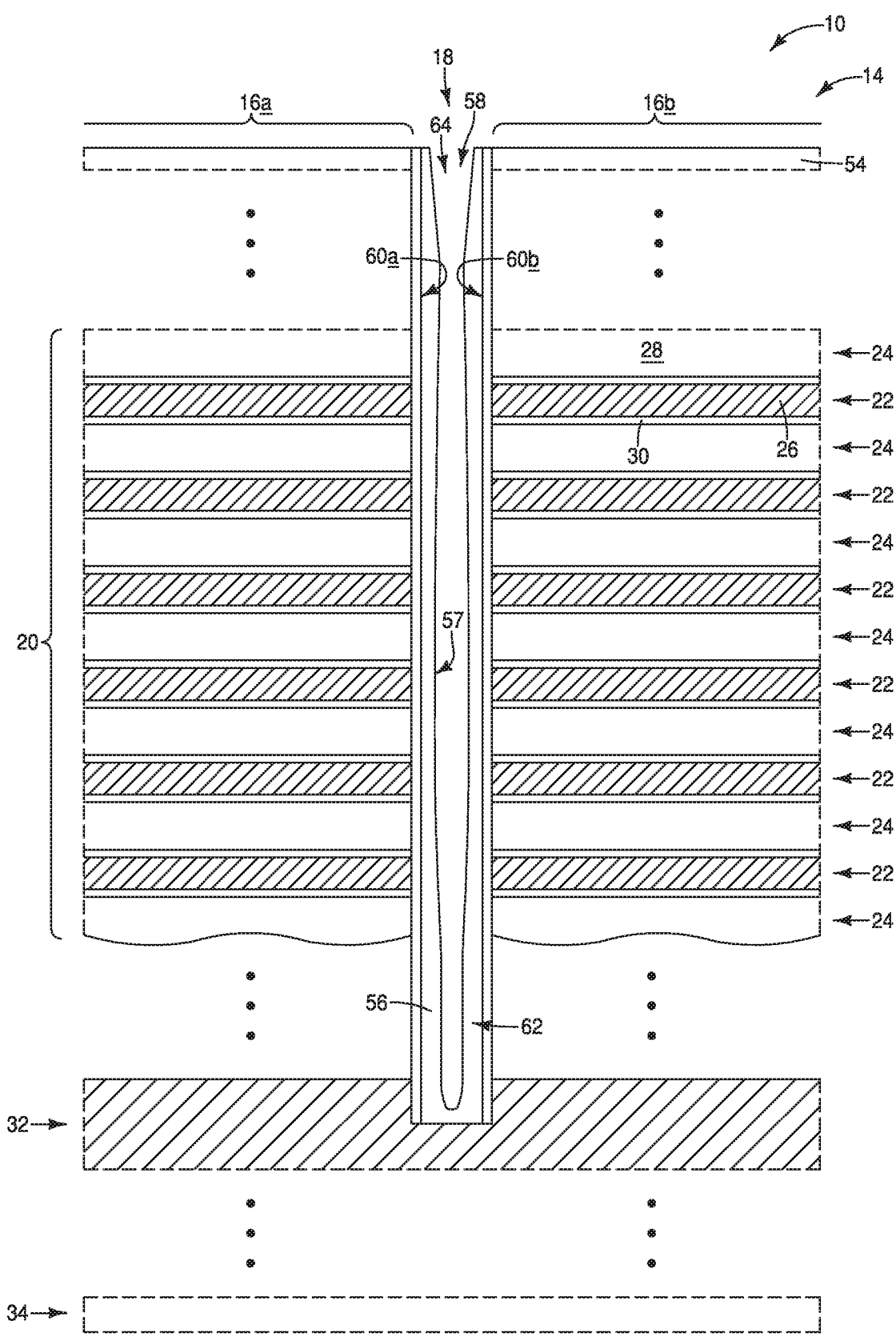

Referring to FIGS. 8A and 8B, an upper region 64 of the cavity 58 is widened. Such widening may utilize one or more suitable etches (e.g., dry etching with one or more halides in applications in which the first material 56 comprises silicon), and/or may utilize CMP. The particular configuration of the widened upper region 64 may be tailored by modifying (tuning) the conditions (e.g., etchant chemistry, duration of etching, etc.) utilized to form such widened upper region.

The container-shape 62 is an upwardly-opening container at the processing stage of FIGS. 8A and 8B. An outer surface 57 of the first material 56 defines a periphery of the cavity 58, with the cavity 58 being an interior region of the upwardly-opening container 62. In some embodiments, the cavity 58 may be considered to comprise an outer periphery which corresponds to the surface 57 of the first material 56.

Figure 9A:
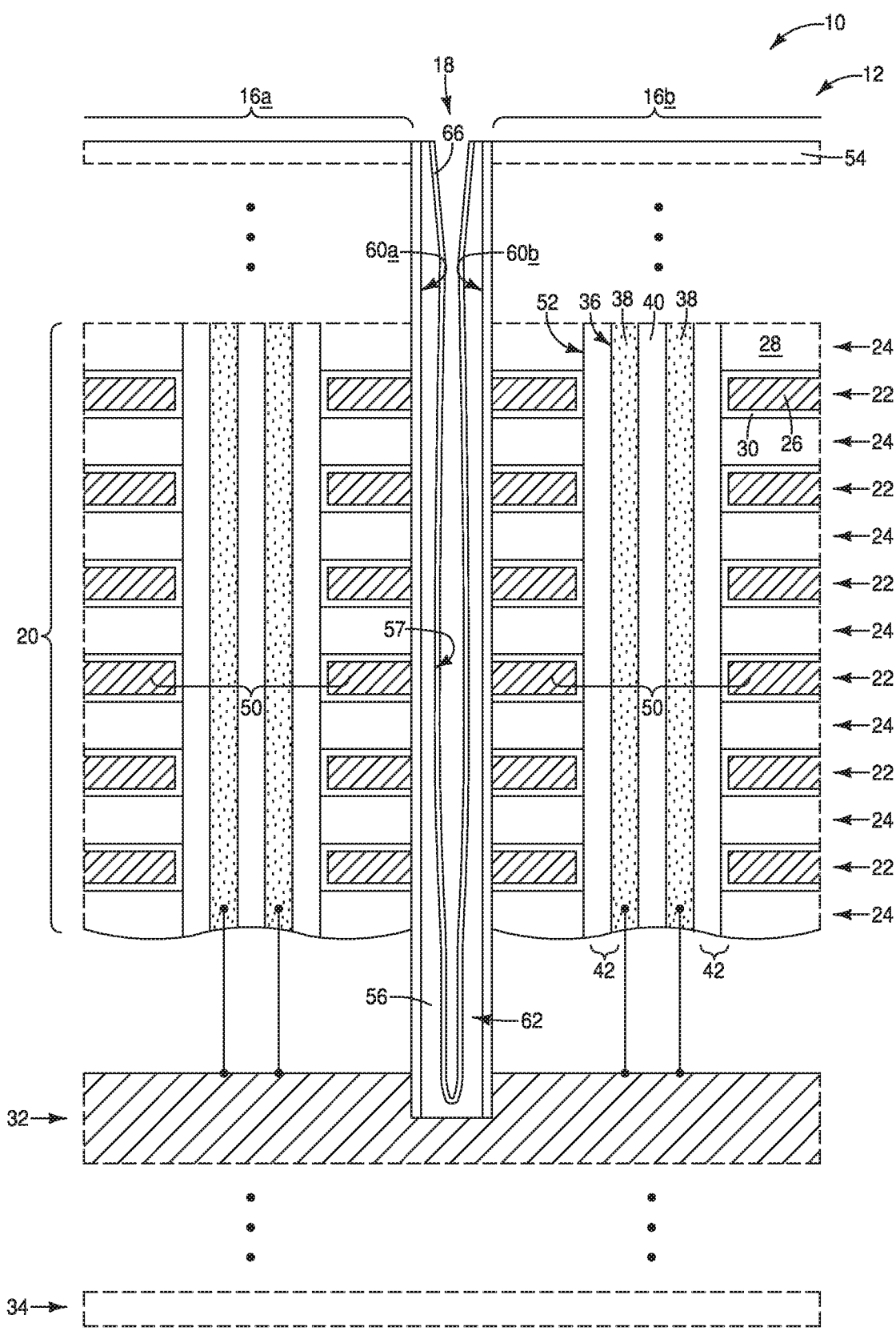
FIGS. 9A and 9B are cross-sectional side views along the same cross-sections as FIGS. 6A and 6B, respectively, at an example process stage subsequent to that of FIGS. 8A and 8B.
Figure 9B:
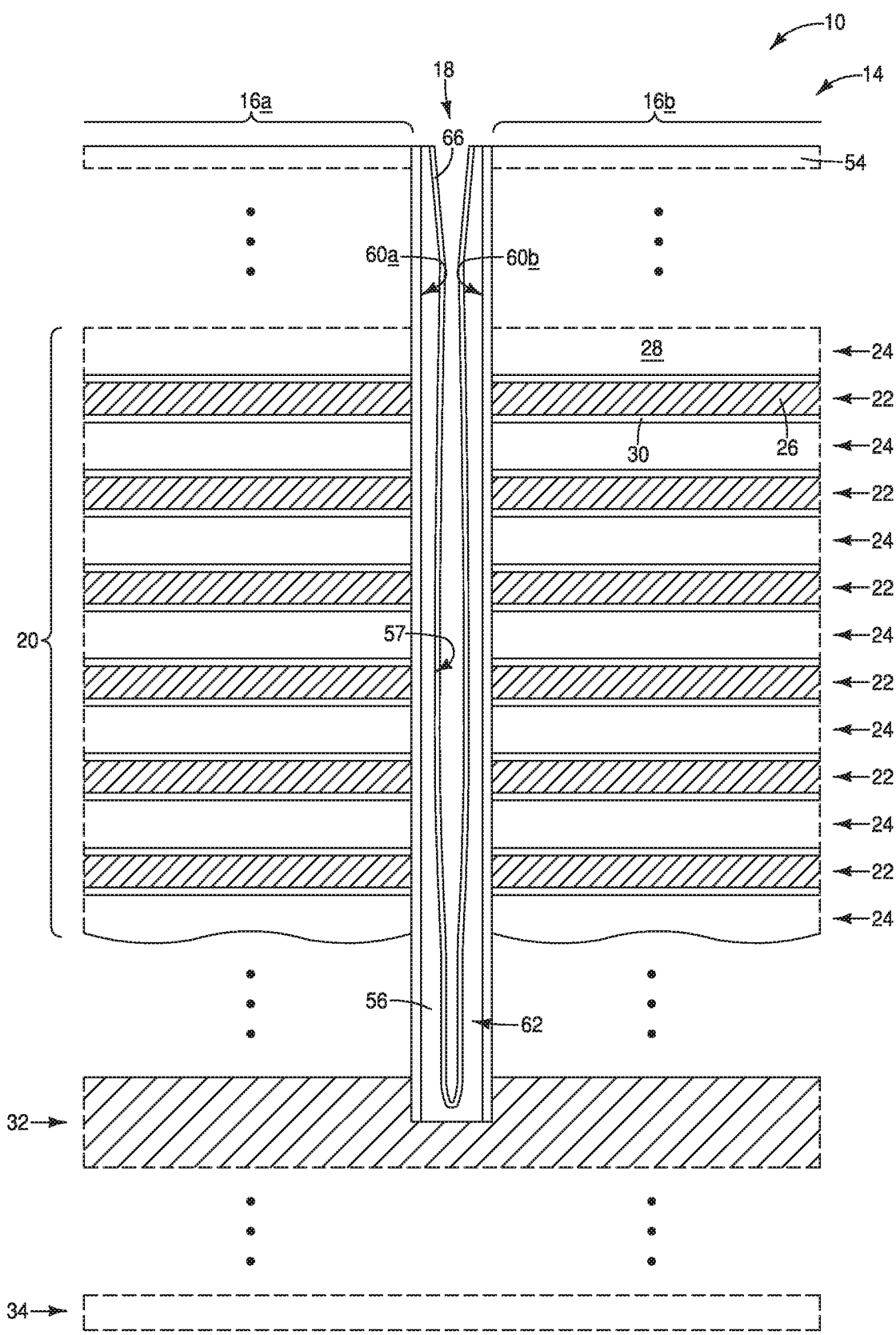

Referring to FIGS. 9A and 9B, the surface 57 is oxidized to form an oxide 66. Such oxidation may occur in applications in which the first material 56 comprises one or more of silicon, germanium and tungsten, and accordingly the oxide may comprise one or more of SiO, GeO and WO; where the chemical formulas indicate primary constituents rather than specific stoichiometries. The oxide may be a native oxide which spontaneously forms when the material 56 is exposed to air. In some embodiments, the oxide 66 may be omitted, either because the material 56 is not exposed to air or because the material 56 is not readily oxidized. In some embodiments, the oxide 56 may be formed by deposition rather than by oxidation of the material 56. In some embodiments, the oxide 66 may be formed by exposing the surface 57 of material 56 to a relatively strong oxidant (e.g., by exposing the material 56 to ozone, hydrogen peroxide, etc.).

The oxide 66 may have any suitable thickness, and in some embodiments may have a thickness within a range of from about 1 nm to about 10 nm.

Figure 10A:
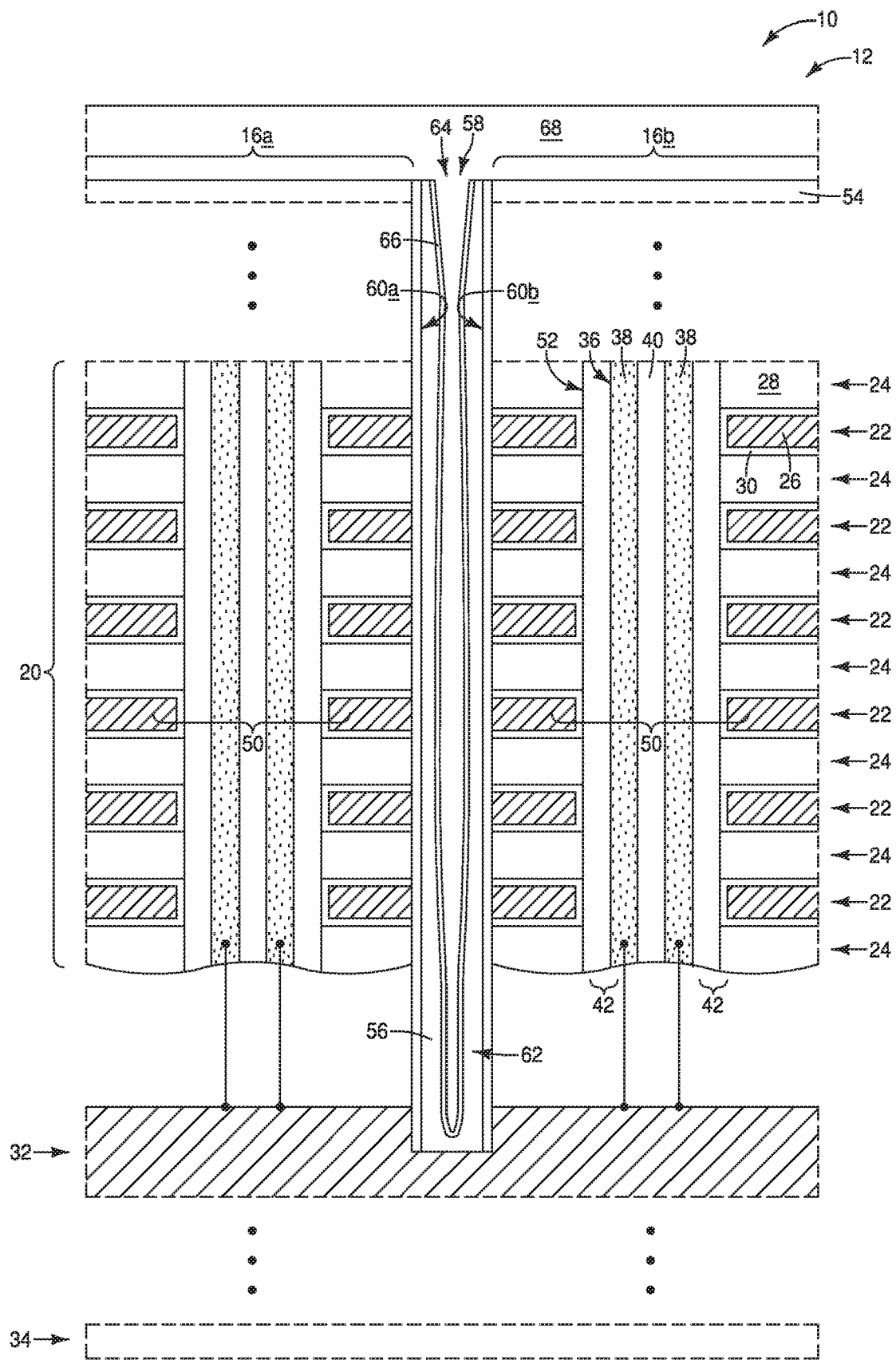
FIGS. 10A and 10B are cross-sectional side views along the same cross-sections as FIGS. 6A and 6B, respectively, at an example process stage subsequent to that of FIGS. 9A and 9B.
Figure 10B:
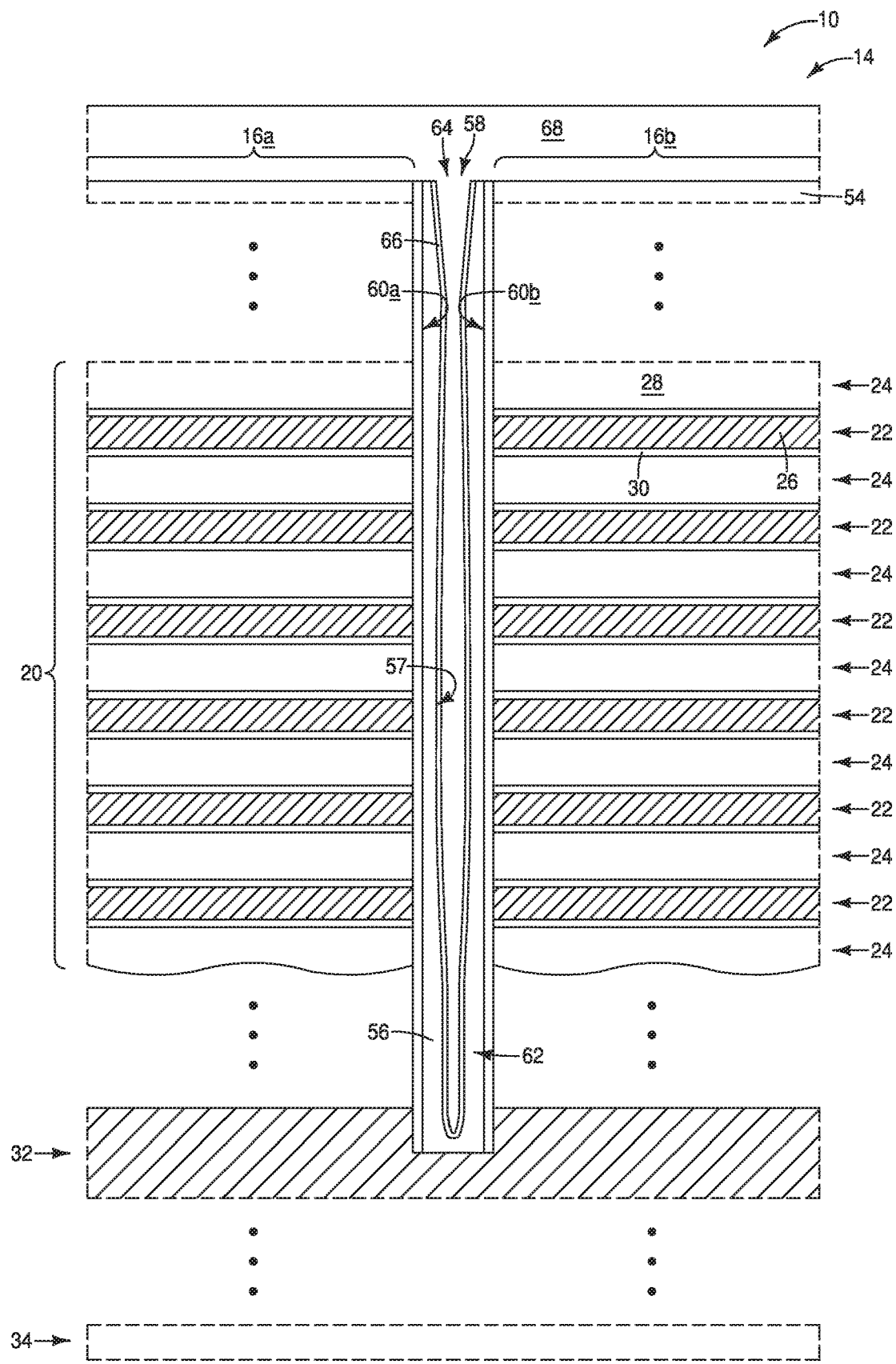

Referring to FIGS. 10A and 10B, second material 68 is formed within the cavity 58. The widened upper region 64 may enable the second material to entirely fill the cavity 58 without voids and/or other defects becoming trapped in the cavity. The second material 68 may be deposited with any suitable methodology, including, for example, CVD.

The second material 68 may comprise any suitable composition(s). In some embodiments, the second material 68 may comprise a same composition as the first material 56, and in other embodiments the second material 60 may comprise a different composition than the first material 56. The second material 68 may comprise any of the materials described above as being suitable for utilization as the first material 56. In some embodiments, the first and second materials 56 and 68 may include one or more of semiconductor material, metal, silicon dioxide and silicon nitride. In some embodiments, the first and second materials 56 and 68 may include one or more of germanium, silicon, tungsten, SiO and SiN, where the chemical formulas indicate primary compositions rather than specific stoichiometries.

In the illustrated embodiment, the second material 68 overfills the cavity 58 such that excess of the second material 68 is over an upper surface of the material 54.

Figure 11A:
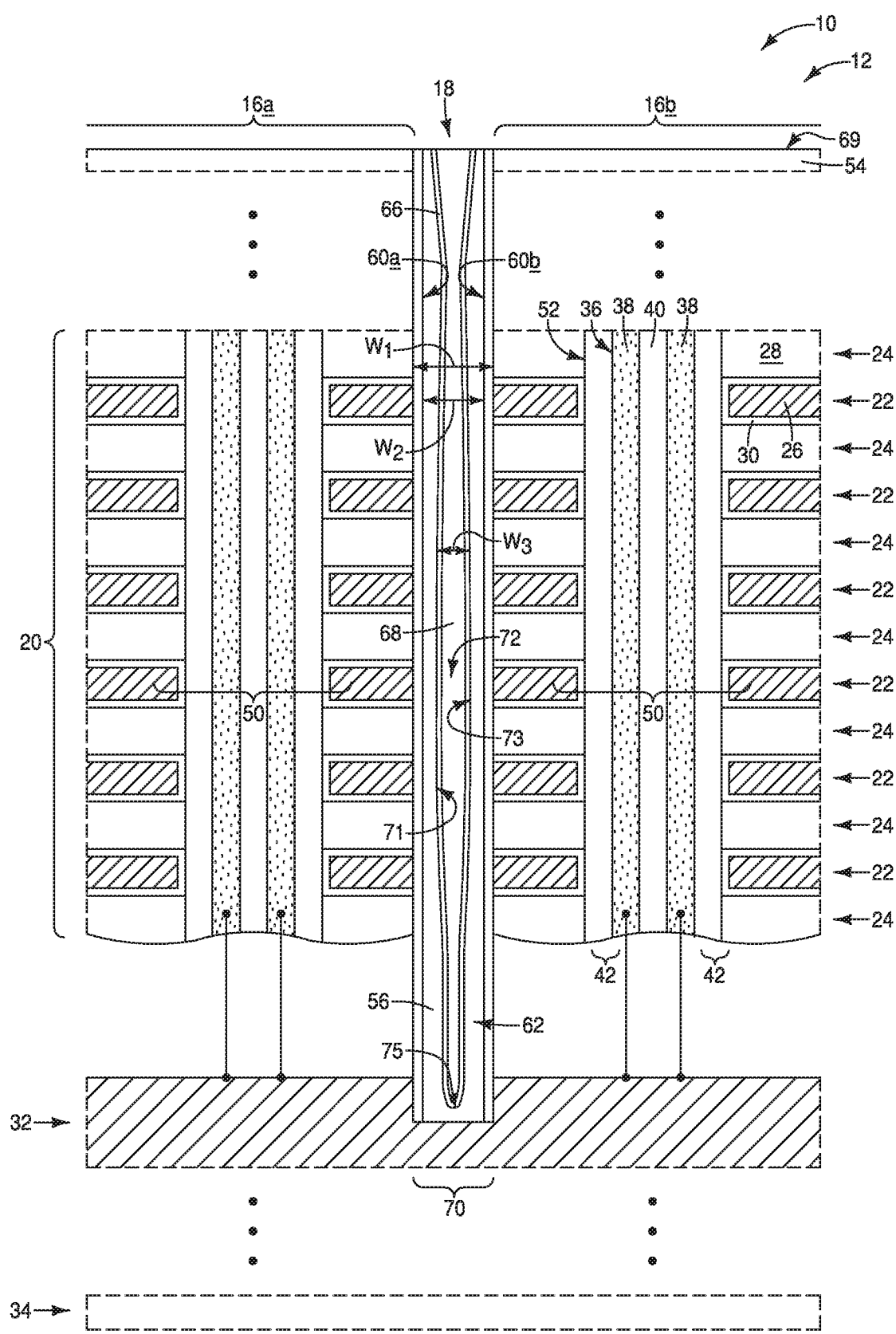
FIGS. 11A and 11B are cross-sectional side views along the same cross-sections as FIGS. 6A and 6B, respectively, at an example process stage subsequent to that of FIGS. 10A and 10B.
Figure 11B:
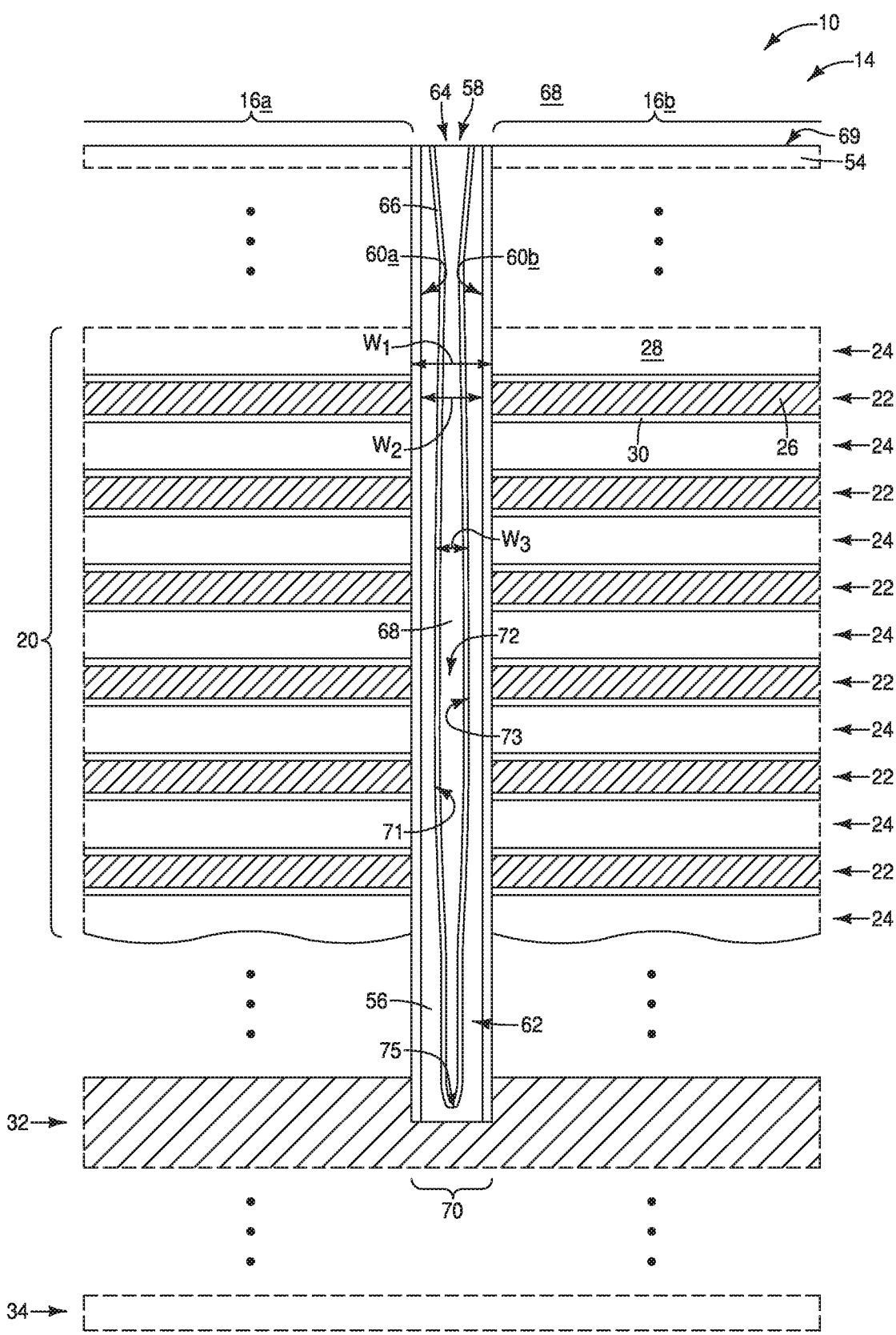

Referring to FIGS. 11A and 11B, the excess second material 68 is removed with a planarization process (e.g., CMP) to form a planarized surface 69 which extends across the materials 54 and 68, and in the shown embodiment also extends across the oxide 66.

The materials within the slit 18 may be considered to form a panel 70 within the slit. The illustrated panel 70 comprises the optional sidewall spacers 60a and 60b, the first material 56, the oxide 66 and the second material 68.

The first material 56 of the panel 70 comprises the container shape 62, with such container shape being in the form of an upwardly-opening container. The container shape 62 defines an interior cavity 72. Specifically, the container shape 62 defines opposing sides 71 and 73 of the interior cavity 72 along the cross-sections of FIGS. 11A and 11B, and defines a bottom 75 of the interior cavity 72.

In some embodiments, the oxide 66 may be considered to be a second material within the cavity 72, and directly against the sides 71 and 73, and bottom 75, defined by the upwardly-opening container 62. In some embodiments, the material 68 may be referred to as the second material within the cavity 72, with such second material being spaced from the first material 56 of the upwardly-opening container 62 by the intervening oxide 66.

The second material provided within the cavity 72 may be compositionally different from the first material 56. If the oxide 66 is considered to be the second material, then the oxide may be considered to line the cavity 72, and the material 68 may be considered to be a third material which is within the lined cavity. The third material 68 may or may not be compositionally different from the first material 56.

The container shape (upwardly-opening container) 62 has a width $W_2$ along the cross-sections of FIGS. 11A and 11B. The width $W_2$ is less than the width $W_1$ of the slit 18 in the shown embodiment due to the presence of the optional spacers 60a and 60b. In other embodiments, the spacers 60a and 60b may be omitted, and thus the width $W_2$ may be the same as the width $W_1$.

The cavity 72 has a width $W_3$ along the cross-sections of FIGS. 11A and 11B. In the illustrated embodiment, the width $W_3$ varies along the vertical direction. However, regardless of such variation, the width $W_3$ of the cavity 72 may be generally related to the width $W_2$ of the container 62. For instance, in some embodiments the width $W_3$ may be within a range of from about 5% to about 95% of the width $W_2$, and in some embodiments may be within a range of from about 10% to about 50% of the width $W_2$.

In the illustrated embodiment, the same panel configuration 70 extends into both the memory array region 12 and the staircase region 14. The enhanced structural integrity of the panel which may be achieved by eliminating (or at least substantially eliminating) voids from within the panel may advantageously alleviate bending, toppling, and/or other structural defects which may otherwise occur within one or both of the memory array region and the staircase region.

Figure 12A:
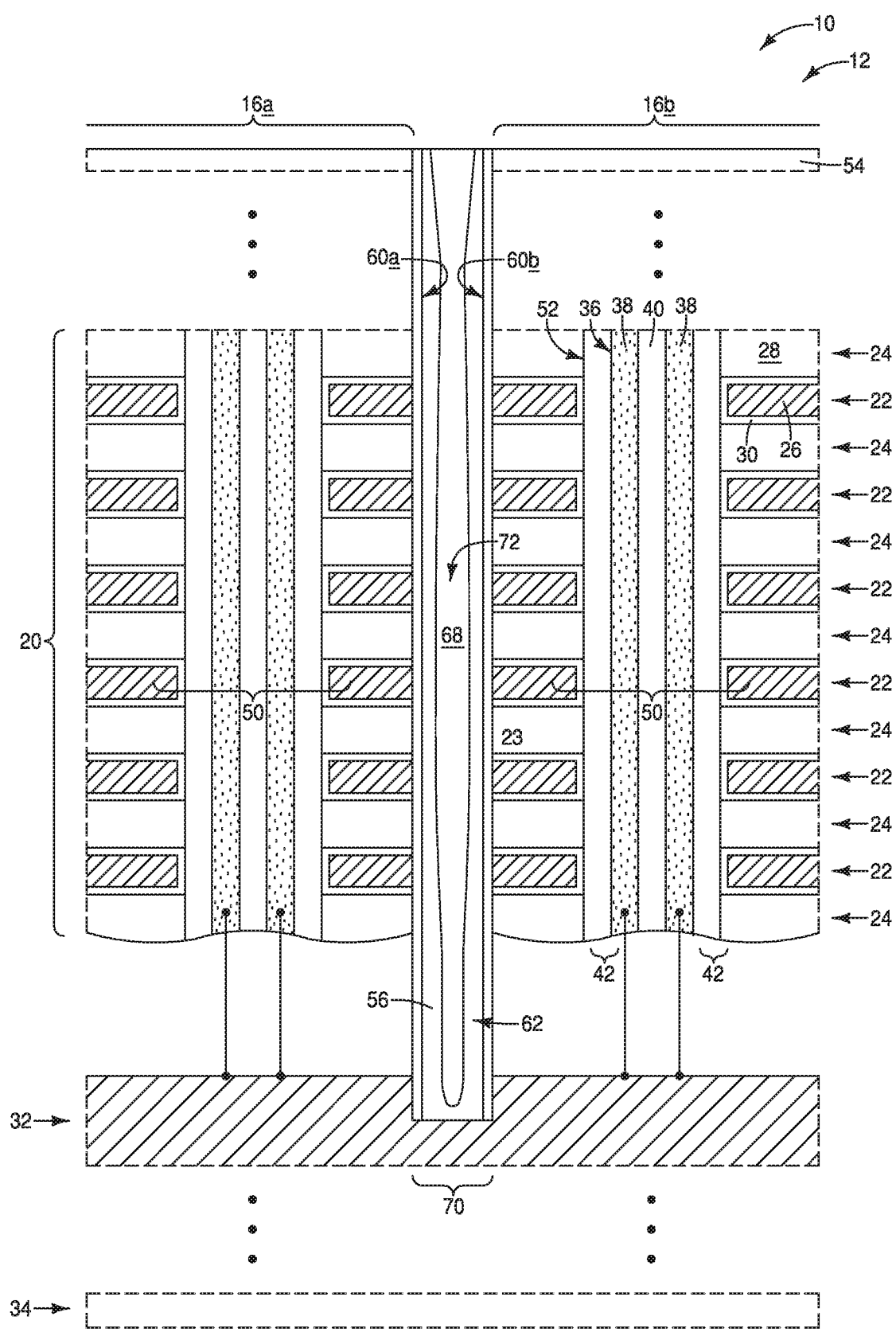
FIGS. 12A and 12B are cross-sectional side views along the same cross-sections as FIGS. 6A and 6B, respectively, at an example process stage subsequent to that of FIGS. 8A and 8B.
Figure 12B:
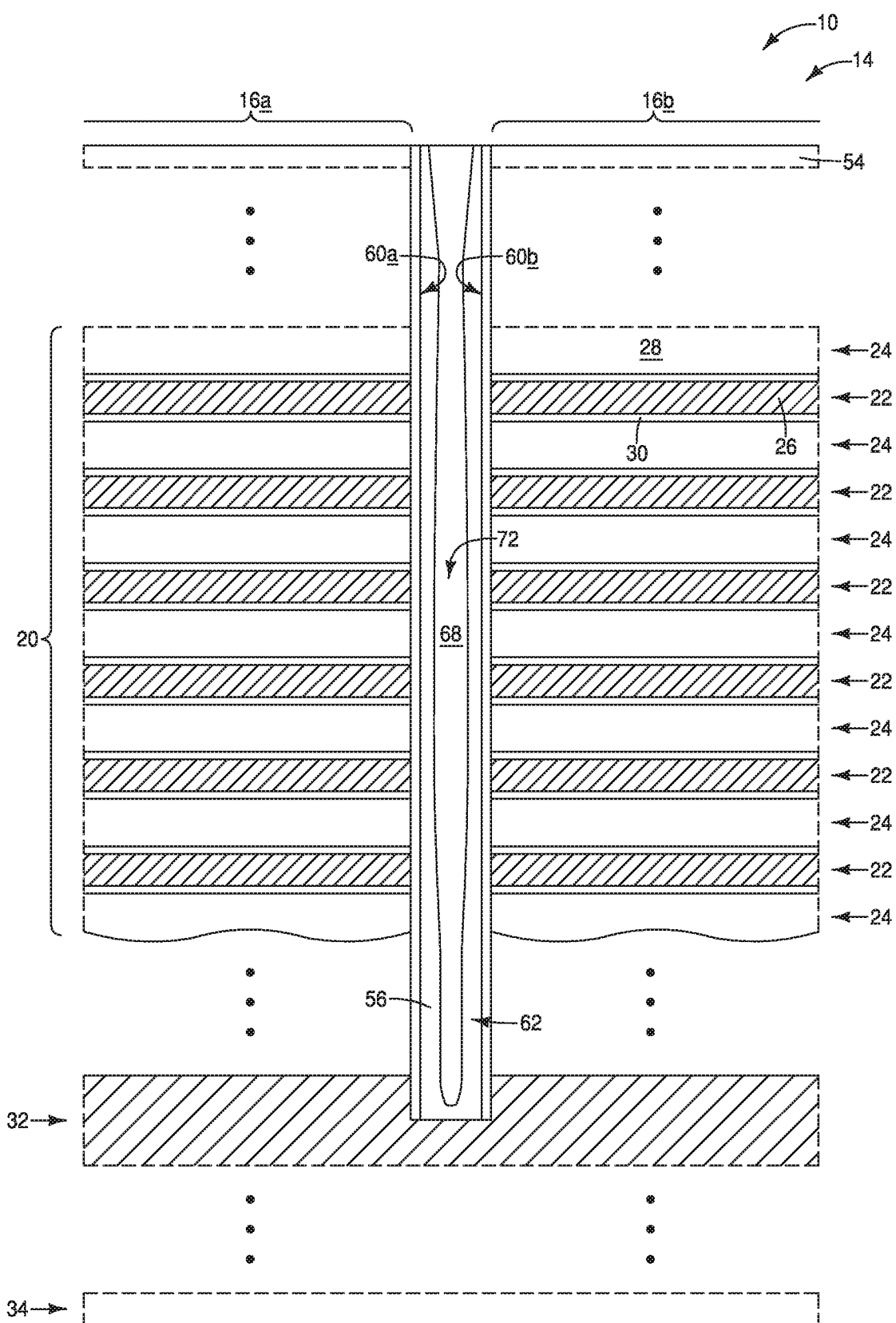

In some embodiments, the oxide 66 may be omitted. FIGS. 12A and 12B show an embodiment similar to that of FIGS. 11A and 11B, but show the material 68 directly against the material 56 (i.e., show an embodiment in which the oxide 66 is omitted). The materials 56 and 68 of FIGS. 12A and 12B may be detectably different from one another. For instance, the material 68 may comprise a different composition than the material 56. Alternatively, or additionally, the material 68 may comprise a different density than the material 56. For instance, in some embodiments the materials 56 and 68 may both comprise silicon dioxide, but may be deposited utilizing different conditions so that one of the materials has a greater density than the other. For instance, in some embodiments the material 68 may be a porous oxide (a low-density silicon dioxide) while the material 56 is a nonporous oxide (a silicon oxide having a density greater than the low-density oxide 68).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a source structure, and having a stack of alternating conductive levels and insulative levels over the source structure. Cell-material-pillars pass through the stack. The cell-material-pillars are arranged within a configuration which includes a first memory-block-region and a second memory-block-region. The cell-material-pillars include channel material. The channel material is electrically coupled with the source structure. Memory cells are along the conductive levels and include regions of the cell-material-pillars. A panel is between the first and second memory-block-regions. The panel has a first material configured as a container shape. The container shape, along a cross-section, defines opposing sides and a bottom of an interior cavity. The panel has a second material within the interior cavity. The second material is compositionally different from the first material.

Some embodiments include a method of forming an integrated assembly. A construction is formed to include a slit which extends through a stack of alternating insulative levels and conductive levels. A first material is formed within the slit to partially fill the slit. A cavity remains within the partially-filled slit. An upper region of the cavity is widened. The cavity is filled with a second material after the widening.

Some embodiments include a method of forming an integrated assembly. A construction is formed to include a slit between a first memory-block-region and a second memory-block-region. The slit has first and second opposing sidewalls. The slit has a bottom which is along a conductive source structure. First and second sidewall spacers are formed along the first and second sidewalls of the slit to narrow the slit. A first material is formed within the narrowed slit to partially fill the narrowed slit. A cavity remains within the partially-filled narrowed slit. The first material within the narrowed slit is configured as a container shape. A bottom region of the container shape is directly against the conductive source structure. The cavity is an interior region of the container shape. The upper region of the cavity is widened. A second material is formed within the cavity after the widening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a source structure;
a stack of alternating conductive levels and insulative levels over the source structure;
cell-material-pillars passing through the stack; the cell-material-pillars being arranged within a configuration which includes a first memory-block-region and a second memory-block-region; the cell-material-pillars including channel material; the channel material being electrically coupled with the source structure;
memory cells along the conductive levels and comprising regions of the cell-material-pillars; and
a panel between the first and second memory-block-regions; the panel having a first material configured as a container shape having a bottom surface contacting the source structure and having outer sidewalls, a width of the container shape being substantially uniform along an entirety of the outer sidewalls; the container shape, along a cross-section, defining opposing sides and a bottom of an interior cavity, an uppermost region of the interior cavity being wider than a remaining region of the interior cavity; the panel having a second material within the interior cavity, with the second material being compositionally different from the first material.

2. The integrated assembly of claim 1 wherein the first material comprises conductive material.

3. The integrated assembly of claim 2 wherein the first material comprises metal.

4. The integrated assembly of claim 2 wherein the first material comprises W.

5. The integrated assembly of claim 1 wherein the first material comprises semiconductor material.

6. The integrated assembly of claim 5 wherein the first material comprises semiconductor oxide.

7. The integrated assembly of claim 5 wherein the first material comprises one or both of Si and Ge.

8. The integrated assembly of claim 1 wherein the first material comprises insulative material.

9. The integrated assembly of claim 8 wherein the first material comprises one or both of silicon dioxide and silicon nitride.

10. The integrated assembly of claim 8 wherein the first material and second materials both comprise silicon dioxide; and wherein the second material has a different density than the first material.

11. The integrated assembly of claim 1 wherein the panel further includes a first sidewall spacer on one side of the first material and a second sidewall spacer on a second side of the first material, with the second side being in opposing relation to the first side along the cross-section.

12. The integrated assembly of claim 11 wherein the first and second sidewall spacers comprise one or both of silicon dioxide and silicon nitride.

13. The integrated assembly of claim 1 wherein the first material has an interior surface along the interior cavity, wherein the second material is a layer of oxide along the interior surface, and wherein a third material is over the layer of oxide and is spaced from the first material by at least the layer of oxide.

14. The integrated assembly of claim 13 wherein the first material comprises one or more of Si, Ge and W.

15. The integrated assembly of claim 13 wherein the third material is compositionally different from the first material.

16. The integrated assembly of claim 13 wherein the third material is compositionally the same as the first material.

17. The integrated assembly of claim 1 wherein the container shape has a first width along the cross-section; wherein the interior cavity has a second width along the cross-section; and wherein the second width is from about 5% to about 95% of the first width.

18. The integrated assembly of claim 17 wherein the second width is from about 10% to about 50% of the first width.

19. The integrated assembly of claim 1 wherein the memory cells are within a memory array region, and further comprising a staircase region proximate the memory array region; and wherein the panel extends into both the memory array region and the staircase region.

* * * * *